US012653026B2

(12) United States Patent　　(10) Patent No.: US 12,653,026 B2
Harrington, III et al.　　(45) Date of Patent: Jun. 9, 2026

(54) POWER SEMICONDUCTOR DEVICES INCLUDING MULTIPLE GATE BOND PADS

(71) Applicant: Wolfspeed, Inc., Durham, NC (US)

(72) Inventors: Thomas E. Harrington, III, Durham, NC (US); Daniel Jenner Lichtenwalner, Raleigh, NC (US); Edward Robert Van Brunt, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 631 days.

(21) Appl. No.: 17/712,649

(22) Filed: Apr. 4, 2022

(65) Prior Publication Data

US 2023/0120729 A1　　Apr. 20, 2023

Related U.S. Application Data

(60) Provisional application No. 63/256,474, filed on Oct. 15, 2021.

(51) Int. Cl.
| | |
|---|---|
| *H10W 20/40* | (2026.01) |
| *H10D 1/47* | (2025.01) |
| *H10D 30/66* | (2025.01) |
| *H10D 62/832* | (2025.01) |
| *H10D 64/23* | (2025.01) |

(52) U.S. Cl.
CPC ............ *H10W 20/484* (2026.01); *H10D 1/47* (2025.01); *H10D 30/668* (2025.01); *H10D 62/8325* (2025.01); *H10D 64/252* (2025.01)

(58) Field of Classification Search
CPC . H01L 23/4824; H01L 28/20; H01L 29/1608; H01L 29/41741; H01L 29/7813; H01L 29/0623; H01L 29/0692; H01L 29/1095; H01L 29/7397; H01L 29/66068; H01L 29/7803; H01L 29/66734; H10D 1/47; H10D 30/668; H10D 62/8325; H10D 64/252; H10D 12/481; H10D 12/031; H10D 84/141; H10D 62/107; H10D 62/126; H10D 62/393; H10D 30/0297; H10D 12/038; H10W 20/484
See application file for complete search history.

(56) References Cited

U.S. PATENT DOCUMENTS

| | | | |
|---|---|---|---|
| 5,726,472 A | 3/1998 | Higashida | |
| 5,903,020 A * | 5/1999 | Siergiej | ............... H10D 12/031 257/77 |
| 11,164,813 B2 | 11/2021 | Lichtenwalner et al. | |
| 2001/0012671 A1* | 8/2001 | Hoshino | ............ H10D 84/0149 438/303 |

(Continued)

FOREIGN PATENT DOCUMENTS

WO　　2014137622 A1　　9/2014

OTHER PUBLICATIONS

"International Search Report and Written Opinion for International Application No. PCTUS22046212 dated Mar. 30, 2023, 21 pages".

*Primary Examiner* — Jacob Y Choi
*Assistant Examiner* — Ashley Nicole Blackwell
(74) *Attorney, Agent, or Firm* — Myers Bigel, P.A.

(57) ABSTRACT

Power semiconductor devices comprise a silicon carbide based semiconductor layer structure including an active region defined therein and a gate bond pad that is on the semiconductor layer structure and vertically overlaps the active region.

27 Claims, 42 Drawing Sheets

(56) References Cited

U.S. PATENT DOCUMENTS

| | | | | |
|---|---|---|---|---|
| 2011/0049532 A1* | 3/2011 | Odekirk | .............. | H10D 62/343 |
| | | | | 257/E21.409 |
| 2011/0291186 A1* | 12/2011 | Yilmaz | .............. | H01L 29/7808 |
| | | | | 257/334 |
| 2014/0001539 A1 | 1/2014 | Yagi et al. | | |
| 2014/0110787 A1* | 4/2014 | Wen | .................... | H10D 62/126 |
| | | | | 257/E27.06 |
| 2014/0246790 A1* | 9/2014 | Haney | .................... | H01L 23/48 |
| | | | | 438/106 |
| 2015/0380543 A1* | 12/2015 | Zink | ................... | H10D 62/127 |
| | | | | 257/334 |
| 2016/0148927 A1* | 5/2016 | Hasegawa | ......... | H10D 62/8325 |
| | | | | 257/77 |
| 2017/0271497 A1* | 9/2017 | Fayed | .............. | H01L 29/42376 |
| 2018/0175062 A1* | 6/2018 | Nagao | ................. | H10D 12/441 |
| 2019/0288082 A1* | 9/2019 | Sagawa | ............. | H10D 62/8325 |
| 2021/0343708 A1* | 11/2021 | Lichtenwalner | ....... | H10D 30/66 |

* cited by examiner

POWER SEMICONDUCTOR DEVICES INCLUDING MULTIPLE GATE BOND PADS

CROSS-REFERENCE TO RELATED APPLICATION

This application claims priority to U.S. Provisional Application Ser. No. 63/256,474, entitled SEMICONDUCTOR DEVICES INCLUDING A GATE BOND PAD, filed in the USPTO on Oct. 15, 2021, the disclosure of which is hereby incorporated by reference herein in its entirety.

FIELD OF THE INVENTION

The present invention relates to power semiconductor devices and, more particularly, to power semiconductor devices including multiple gate bond pads.

BACKGROUND

A wide variety of power semiconductor devices are known in the art including, for example, power Metal Oxide Semiconductor Field Effect Transistors ("MOSFETs"), Insulated Gate Bipolar Transistors ("IGBTs") and various other devices. These power semiconductor devices are often fabricated from wide bandgap semiconductor materials such as silicon carbide or gallium nitride based materials. Herein, the term "wide bandgap semiconductor" encompasses any semiconductor having a bandgap of at least 1.4 eV. Power semiconductor devices are designed to selectively block or pass large voltages and/or currents. For example, in the blocking state, a power semiconductor device may be designed to sustain hundreds or thousands of volts of electric potential.

Power semiconductor devices such as a power MOSFET can have a lateral structure or a vertical structure. A power MOSFET having a lateral structure has both the source region and the drain region of the MOSFET on the same major surface (i.e., upper or lower) of a semiconductor layer structure of the device. In contrast, a power MOSFET having a vertical structure has its source region on one major surface of the semiconductor layer structure and its drain region on the other (opposed) major surface thereof. Vertical device structures are typically used in very high power applications, as the vertical structure allows for a thick semiconductor drift layer that can support high current densities and block high voltages. Herein, the term "semiconductor layer structure" refers to a structure that includes one or more semiconductor layers such as semiconductor substrates and/or semiconductor epitaxial layers.

A conventional vertical silicon carbide power MOSFET includes a silicon carbide drift region that is formed on a silicon carbide substrate, such as a silicon carbide wafer. The MOSFET has an active region, as well as one or more inactive regions such as a termination region that may surround the active region and/or a gate bond pad region. The active region acts as a main junction for blocking voltage during reverse bias operation and providing current flow during forward bias operation. The power MOSFET typically has a unit cell structure, meaning that the active region includes a large number of individual "unit cell" MOSFETs that are electrically connected in parallel to function as a single power MOSFET. In high power applications, such a device may include thousands or tens of thousands of unit cells. It is generally desirable to maximize the total active area of the power MOSFET, since total active area is directly proportional to current carrying capacity.

Many power semiconductor devices, such as power MOSFETs and IGBTs, have gate structures. These devices can be turned on and off by applying different bias voltages to the gate structures thereof. The gate structure has a distributed gate resistance, which is a function of the length of the electrical path from the gate bond pad (or other gate terminal) to the gate finger of each individual unit cell and the sheet resistance of the materials forming the gate structure. The gate structure may comprise, for example, the gate bond pad, a plurality of gate fingers in the active region of the device, a gate pad, one or more gate buses that extend between the gate pad and the gate fingers.

SUMMARY

Pursuant to embodiments of the present invention, semiconductor devices are provided that comprise a silicon carbide based semiconductor layer structure including an active region defined therein, and a gate bond pad that is on the semiconductor layer structure and vertically overlaps the active region.

In some embodiments, more than half the gate bond pad vertically overlaps the active region.

In some embodiments, the semiconductor devices may also comprise a plurality of source regions in the active region, and a source contact that is electrically connected to the plurality of source regions, wherein the source contact extends underneath the gate bond pad.

The semiconductor devices may further comprise a gate bus that is electrically connected to the gate bond pad, and a dielectric layer that covers the gate bus and the source contact. Further, the semiconductor devices may comprise a source bond pad that is on the source contact and is electrically connected to the source contact through one or more first conductive vias that extend through the dielectric layer and/or a conductive gate connector that is underneath the gate bond pad and is electrically connected to the gate bond pad through a second conductive via that extends through the dielectric layer. Additionally, the semiconductor devices may comprise a gate resistor that electrically connects the conductive gate connector to the gate bus and/or a field oxide layer that is interposed between the conductive gate connector and the semiconductor layer structure.

In some embodiments, the semiconductor devices may also comprise a field oxide layer that is interposed between the gate bus and the semiconductor layer structure.

In some embodiments, the gate bond pad comprises a first gate bond pad, and the semiconductor device further comprises a second gate bond pad that is spaced apart from the first gate bond pad, and the second gate bond pad is on the semiconductor layer structure and vertically overlaps the active region.

The first gate bond pad is adjacent a first side of the semiconductor layer structure, and the second gate bond pad is adjacent a second side of the semiconductor layer structure. The first side is opposite the second side when the semiconductor device is viewed from above. In some embodiments, the first gate bond pad and the second gate bond pad are each positioned about midway between a third side of the semiconductor layer structure and a fourth side of the semiconductor layer structure, and where the fourth side is opposite the third side when the semiconductor device is viewed from above In some embodiments, the semiconductor devices may further comprise a third gate bond pad that is positioned between the first gate bond pad and the second gate bond pad.

In some embodiments, the semiconductor devices may further comprise a third gate bond pad and a fourth gate bond pad. The first, second, third and fourth gate bond pads are positioned above respective first, second, third and fourth corner regions of the semiconductor layer structure.

In some embodiments, the semiconductor devices may further comprise a plurality of source regions in the active region, a source contact that is electrically connected to the plurality of source regions, and a gate bus that is electrically connected to the gate bond pad. The gate bus comprises a gate bus connector that vertically overlaps the source contact.

In some embodiments, the semiconductor devices may further comprise a gate electrode extending on the semiconductor layer structure. The gate bus further comprises a conductive gate bus plug that protrudes from the gate bus connector of the gate bus toward the semiconductor layer structure and contacts the gate electrode.

In some embodiments, the gate bus connector comprises a first gate bus connector, and the gate bus further comprises a second gate bus connector. The first gate bus connector extends longitudinally in a first horizontal direction that is parallel to an upper surface of the semiconductor layer structure, and the second gate bus connector protrudes from the first gate bus connector and extends longitudinally in a second horizontal direction that is parallel to the upper surface of the semiconductor layer structure and is different from the first horizontal direction.

The semiconductor devices may further comprise first and second gate electrodes that are on the semiconductor layer structure and extend longitudinally in the first horizontal direction, The gate bus further comprises a first conductive gate bus plug and a second conductive gate bus plug, the first conductive gate bus plug protrudes from the first gate bus connector toward the first gate electrode and contacts the first gate electrode, and the second conductive gate bus plug extends from the second gate bus connector toward the second gate electrode and contacts the second gate electrode. Additionally, the semiconductor devices may comprise first and second field oxide layers, wherein the first and second conductive gate bus plugs vertically overlaps the first and second field oxide layers, respectively.

In some embodiments, the semiconductor devices may also comprise a gate electrode that is on the semiconductor layer structure and extends longitudinally in a first horizontal direction that is parallel to an upper surface of the semiconductor layer structure, and a gate resistor that is electrically connected to the gate bond pad and extends from the gate electrode in a second horizontal direction that is parallel to the upper surface of the semiconductor layer structure and is different from the first horizontal direction.

The semiconductor devices may further comprise a conductive gate connector that is underneath the gate bond pad, is electrically connected to the gate bond pad and contacts the gate resistor.

The gate bond pad comprises a first gate bond pad, and the semiconductor device further comprises a second gate bond pad that is on the semiconductor layer structure, vertically overlaps the active region and is spaced apart from the first gate bond pad in a first horizontal direction that is parallel to an upper surface of the semiconductor layer structure, a first gate resistor that is electrically connected to the first gate bond pad and extends longitudinally in a second horizontal direction that is parallel to the upper surface of the semiconductor layer structure and is different from the first horizontal direction, and a second gate resistor that is electrically connected to the second gate bond pad and extends longitudinally in the second horizontal direction.

The semiconductor devices may further comprise a first conductive gate connector that is underneath the first gate bond pad, is electrically connected to the first gate bond pad and contacts the first gate resistor, and a second conductive gate connector that is underneath the second gate bond pad, is electrically connected to the second gate bond pad and contacts the second gate resistor.

Pursuant to embodiments of the present invention, semiconductor devices are provided that comprise a silicon carbide based semiconductor layer structure, a source bond pad on the semiconductor layer structure, and a plurality of gate bond pads that are on the semiconductor layer structure and are spaced apart from each other.

In some embodiments, the plurality of gate bond pads comprise a first gate bond pad that is adjacent a first side of the semiconductor layer structure and a second gate bond pad that is adjacent a second side of the semiconductor layer structure, and where the second side is opposite the first side In some embodiments, the first gate bond pad and the second gate bond pad are each positioned about midway between a third side of the semiconductor layer structure and a fourth side of the semiconductor layer structure, where the fourth side is opposite the third side when the semiconductor device is viewed from above.

In some embodiments, the semiconductor devices may also comprise a third gate bond pad that is positioned between the first gate bond pad and the second gate bond pad. The third gate bond pad is positioned above a center of the upper surface of the semiconductor layer structure.

In some embodiments, the semiconductor devices may also comprise a third gate bond pad and a fourth gate bond pad, wherein the first, second, third and fourth gate bond pads are positioned above respective first, second, third and fourth corner regions of the upper surface of the semiconductor layer structure.

In some embodiments, the semiconductor devices may also comprise a gate bus that is electrically connected to the plurality of gate bond pads, and a dielectric layer that covers the gate bus.

In some embodiments, the semiconductor devices may also comprise a plurality of gate bond pads that vertically overlap the plurality of conductive gate connectors, respectively, and a plurality of conductive vias that extend through the dielectric layer, wherein each of the plurality of conductive vias electrically connects a respective one of the plurality of conductive gate connectors to a respective one of the plurality of gate bond pads.

The semiconductor devices may further comprise a plurality of gate bond pads that vertically overlap the plurality of conductive gate connectors, respectively, and a plurality of conductive vias that extend through the dielectric layer, wherein each of the plurality of conductive vias electrically connects a respective one of the plurality of conductive gate connectors to a respective one of the plurality of gate bond pads.

The semiconductor devices may further comprise a plurality of gate bond pads that vertically overlap the plurality of conductive gate connectors, respectively, and a plurality of conductive vias that extend through the dielectric layer, wherein each of the plurality of conductive vias electrically connects a respective one of the plurality of conductive gate connectors to a respective one of the plurality of gate bond pads.

The semiconductor devices may further comprise a plurality of gate resistors, wherein each of the plurality of gate resistor electrically connects a respective one of the plurality of conductive gate connectors to the gate bus.

The semiconductor devices may further comprise a plurality of field oxide layers, wherein each of the plurality of field oxide layers is interposed between the semiconductor layer structure and a respective one of the plurality of conductive gate connectors.

In some embodiments, the semiconductor devices may also comprise a plurality of field oxide layers that is interposed between a respective one of the plurality of gate bond pads and the semiconductor layer structure.

In some embodiments, the semiconductor devices may further comprise a plurality of source regions in the semiconductor layer structure, a source contact that is electrically connected to the plurality of source regions, and a gate bus that is electrically connected to the plurality of gate bond pads. The gate bus comprises a gate bus connector that vertically overlaps the source contact.

The semiconductor devices may further comprise a gate electrode extending on the semiconductor layer structure, wherein the gate bus further comprises a conductive gate bus plug that protrudes from the gate bus connector toward the semiconductor layer structure and contacts the gate electrode.

In some embodiments, the gate bus connector comprises a first gate bus connector, and the gate bus further comprises a second gate bus connector, and the first gate bus connector extends longitudinally in a first horizontal direction that is parallel to an upper surface of the semiconductor layer structure, and the second gate bus connector protrudes from the first gate bus connector and extends longitudinally in a second horizontal direction that is parallel to the upper surface of the semiconductor layer structure and is different from the first horizontal direction.

In some embodiments, the semiconductor devices may further comprise first and second gate electrodes that are on the semiconductor layer structure and extend longitudinally in the first horizontal direction, wherein the gate bus further comprises a first conductive gate bus plug and a second conductive gate bus plug, the first conductive gate bus plug protrudes from the first gate bus connector toward the first gate electrode and contacts the first gate electrode, and the second conductive gate bus plug extends from the second gate bus connector toward the second gate electrode and contacts the second gate electrode. Further, the semiconductor devices may comprise first and second field oxide layers, wherein the first and second conductive gate bus plugs vertically overlaps the first and second field oxide layers, respectively.

In some embodiments, the semiconductor devices may further comprise a plurality of source regions in the semiconductor layer structure, and a source contact that is electrically connected to the plurality of source regions, wherein at least one of the plurality of gate bond pads vertically overlaps the source contact.

Pursuant to embodiments of the present invention, semiconductor devices are provided that comprise a silicon carbide based semiconductor layer structure including an active region defined therein, a plurality of source regions in the active region, a source contact that is electrically connected to the plurality of source regions, a plurality of gate electrodes on the semiconductor layer structure, and a gate bus that is electrically connected to the plurality of gate electrodes. The gate bus comprises a gate bus connector that vertically overlaps the source contact.

In some embodiments, the semiconductor devices may further comprise a dielectric layer that is interposed between the source contact and the gate bus connector. The gate bus may further comprises a conductive gate bus plug that is in the dielectric layer, protrudes from the gate bus connector toward the semiconductor layer structure and contacts one of the plurality of gate electrodes. The conductive gate bus plug is above a center of an upper surface of the semiconductor layer structure. Further, the semiconductor devices may comprise a field oxide layer, wherein the conductive gate bus plug vertically overlaps the field oxide layer.

In some embodiments, the gate bus connector comprises a first gate bus connector, and the gate bus further comprises a second gate bus connector, and the first gate bus connector extends longitudinally in a first horizontal direction that is parallel to an upper surface of the semiconductor layer structure, and the second gate bus connector protrudes from the first gate bus connector and extends longitudinally in a second horizontal direction that is parallel to the upper surface of the semiconductor layer structure and is different from the first horizontal direction.

In some embodiments, the plurality of gate electrodes comprises first and second gate electrodes that are on the semiconductor layer structure and are spaced apart from each other in the second horizontal direction. The gate bus further comprises a first conductive gate bus plug and a second conductive gate bus plug, the first conductive gate bus plug protrudes from the first gate bus connector toward the first gate electrode and contacts the first gate electrode, and the second conductive gate bus plug extends from the second gate bus connector toward the second gate electrode and contacts the second gate electrode.

The semiconductor devices may further comprise first and second field oxide layers, wherein the first and second conductive gate bus plugs vertically overlaps the first and second field oxide layers, respectively.

In some embodiments, the semiconductor devices may further comprise a gate bond pad that is on the semiconductor layer structure and is electrically connected to the gate bus. The gate bond pad vertically overlaps the active region.

The semiconductor devices may further comprise a conductive gate connector, wherein the gate bond pad vertically overlaps the conductive gate connector, and a conductive via that is interposed between the gate bond pad and the conductive gate connector and contacts both the gate bond pad and the conductive gate connector.

The semiconductor devices may further comprise a gate resistor, wherein the gate resistor electrically connects the conductive gate connector to the gate bus.

The semiconductor devices may further comprise a field oxide layer, wherein the field oxide layer is interposed between the semiconductor layer structure and the conductive gate connector.

In some embodiments, the plurality of gate electrodes comprises a first gate electrode, and the gate bus further comprises a conductive gate bus plug. The conductive gate bus plug is electrically connected to the gate bus connector and the first gate electrode, and an upper surface of the gate bus connector is higher than an upper surface of the conductive gate bus plug. The conductive gate bus plug contacts the first gate electrode.

Pursuant to embodiments of the present invention, semiconductor devices are provided that comprise providing a silicon carbide based semiconductor layer structure that includes an active region defined therein and a plurality of source regions in the active region, forming a plurality of gate structures on the semiconductor layer structure, wherein each of the plurality of gate structures comprises a gate electrode and a gate capping layer on the gate electrode, forming a source contact on the plurality of source regions, wherein the source contact is electrically connected to the plurality of source regions, forming a conductive gate connector on a first of the plurality of gate structures, the conductive gate connector electrically connected to the gate electrode of the first of the plurality of gate structures, forming a dielectric layer on the source contact and the conductive gate connector, and forming a source bond pad and a gate bond pad on the dielectric layer, wherein the source bond pad is electrically connected to the source contact, and the gate bond pad is electrically connected to the conductive gate connector.

In some embodiments, the methods may further comprise forming a first conducive via and a second conductive via in the dielectric layer before forming the source bond pad and the gate bond pad. The first conducive via is interposed between the source bond pad and the source contact and contacts both the source bond pad and the source contact, and the second conductive via is interposed between the gate bond pad and the conductive gate connector and contacts both the gate bond pad and the conductive gate connector.

In some embodiments, the methods may further comprise forming a field oxide layer on the semiconductor layer structure before forming the plurality of gate structures. The conductive gate connector vertically overlaps the field oxide layer.

In some embodiments, forming the source contact and the conductive gate connector comprises forming a first metal layer on the plurality of source regions and the plurality of gate structures, and patterning the first metal layer thereby forming the source contact and the conductive gate connector that comprise first and second portions of the first metal layer, respectively.

In some embodiments, patterning the first metal layer further forms a gate bus that comprises a third portion of the first metal layer and is electrically connected to the conductive gate connector.

In some embodiments, the gate bus comprises a conductive gate bus plug, and the method further comprises forming a second metal layer on the dielectric layer, and patterning the second metal layer thereby forming a gate bus connector of the gate bus that comprises a portion of the second metal layer, contacts the conductive gate bus of the gate bus and vertically overlaps the source contact.

In some embodiments, the gate bus connector comprises a first gate bus connector extending a first horizontal direction that is parallel to an upper surface of the semiconductor layer structure, and patterning the second metal layer further forms a second gate bus connector of the gate bus that protrudes from the first gate bus connector and extend in a second horizontal direction that is parallel to the upper surface of the semiconductor layer structure and is different from the first horizontal direction.

In some embodiments, forming the source bond pad and the gate bond pad comprises forming a second metal layer on the dielectric layer, and patterning the second metal layer thereby forming the source bond pad and the gate bond pad that comprise first and second portions of the second metal layer, respectively.

DETAILED DESCRIPTION

Figure 1:
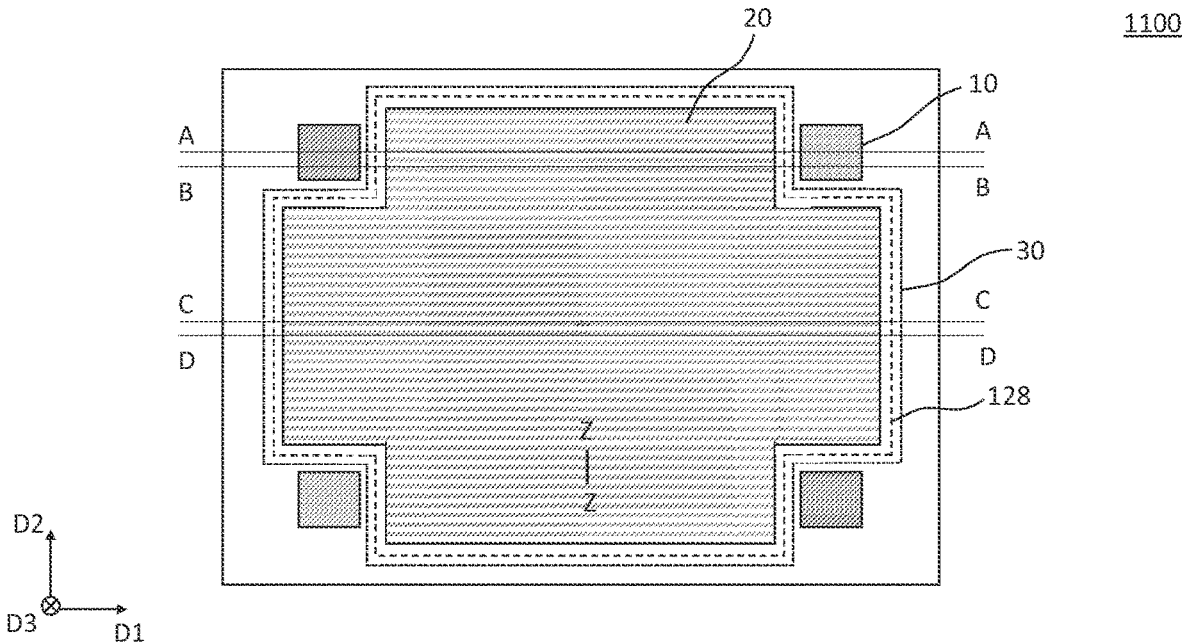
FIGS. 1, 2 and 5 are plan views of MOSFETs that include a single metal layer according to embodiments of the present invention.

It is generally desirable to increase switching speed and reduce power consumption of a power semiconductor device. According to embodiments of the present invention, a power semiconductor device includes multiple gate bond pads to facilitate more efficient propagation of the gate voltage to all regions of the device, which allows faster and more power-efficient switching of the device.

It is also generally desirable to maximize the total area of an active region of a power semiconductor device, since this total area is directly proportional to current carrying capacity. Further, increasing the total area of an active region allows for an increase in current carrying capacity for a given size. Alternatively, increasing the total area of an active region allows for a decrease in size of the device without sacrificing current carrying capacity. In conventional power semiconductor devices, no active area is allowed underneath a gate bond pad, and thus the number of gate bond pads cannot be increased without degrading the current carrying capacity. According to embodiments of the present invention, a power semiconductor device includes gate bond pads, some or all of which include at least a portion vertically overlapping an active region, such that the number of gate bond pads can be increased without significantly reducing the total area of the active region. Herein, a first element (e.g., a gate bond pad) of a semiconductor device "vertically overlaps" a second element (e.g., an active region) of the semiconductor device if an axis that is perpendicular to a major surface of a semiconductor layer structure of the semiconductor device passes through both the first and second elements.

Further, it is generally desirable to reduce gate bus resistance for high speed operation of a power semiconductor device. Gate bus resistance can be reduced by using a wide gate bus but that reduces the total area of an active region, as an area underneath a conventional gate bus cannot be used as an active region. According to embodiments of the present invention, a second metal gate bus is provided above the gate bus and is electrically connected to the gate bus. Accordingly, the composite resistance of the second metal gate bus and the gate bus can be reduced without a wide gate bus.

According to embodiments of the present invention, a semiconductor device may include a silicon carbide based semiconductor layer structure including an active region defined therein and a gate bond pad that is on the semiconductor layer structure and vertically overlapping the active region.

According to embodiments of the present invention, a semiconductor device may include a silicon carbide based semiconductor layer structure, a source bond pad on the semiconductor layer structure, and a plurality of gate bond pads that are on the semiconductor layer structure and are spaced apart from each other.

According to embodiments of the present invention, a semiconductor device may include a silicon carbide based semiconductor layer structure including an active region defined therein, a plurality of source regions in the active region, a source contact that is electrically connected to the source regions, a plurality of gate electrodes on the semiconductor layer structure, and a gate bus that is electrically connected to the gate electrodes. The gate bus may include a gate bus connector that vertically overlaps the source contact.

According to embodiments of the present invention, a method of forming a semiconductor device may include providing a silicon carbide based semiconductor layer structure that includes an active region defined therein and a plurality of source regions in the active region and forming a plurality of gate structures on the semiconductor layer structure. Each of the gate structures may include a gate electrode and a gate capping layer on the gate electrode. The method may also include forming a source contact on the source regions, forming a conductive gate connector on a first of the gate structures, forming a dielectric layer on the source contact and the conductive gate connector, and forming a source bond pad and a gate bond pad on the dielectric layer. The source contact is electrically connected to the source regions, and the conductive gate connector is electrically connected to the gate electrode of the first of the gate structures. The source bond pad is electrically connected to the source contact, and the gate bond pad is electrically connected to the conductive gate connector.

Figure 1A:
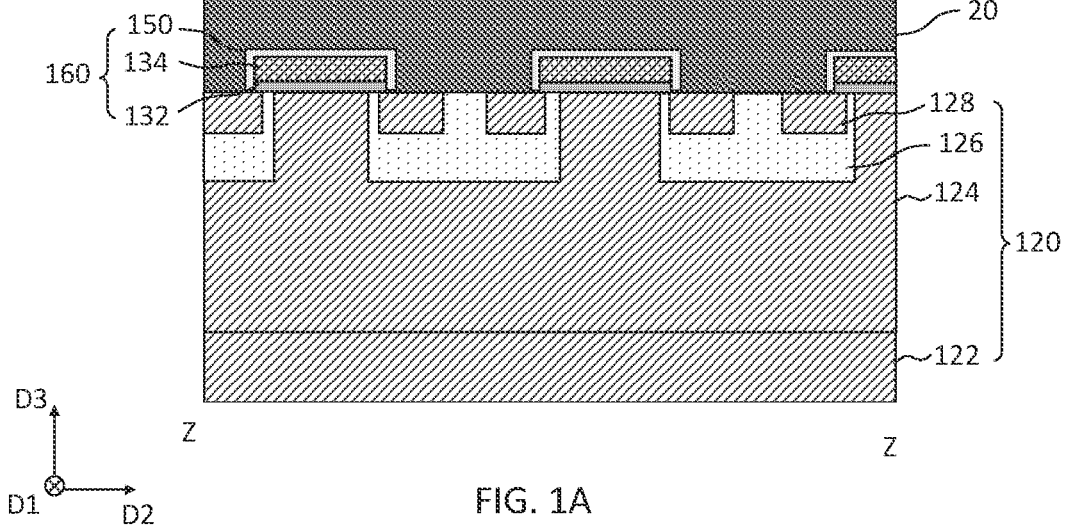
FIGS. 1A, 3, 4, 6, 7, 8 and 9 are cross-sectional views of the MOSFETs in FIGS. 1, 2 and 5 according to embodiments of the present invention.
Figure 2:
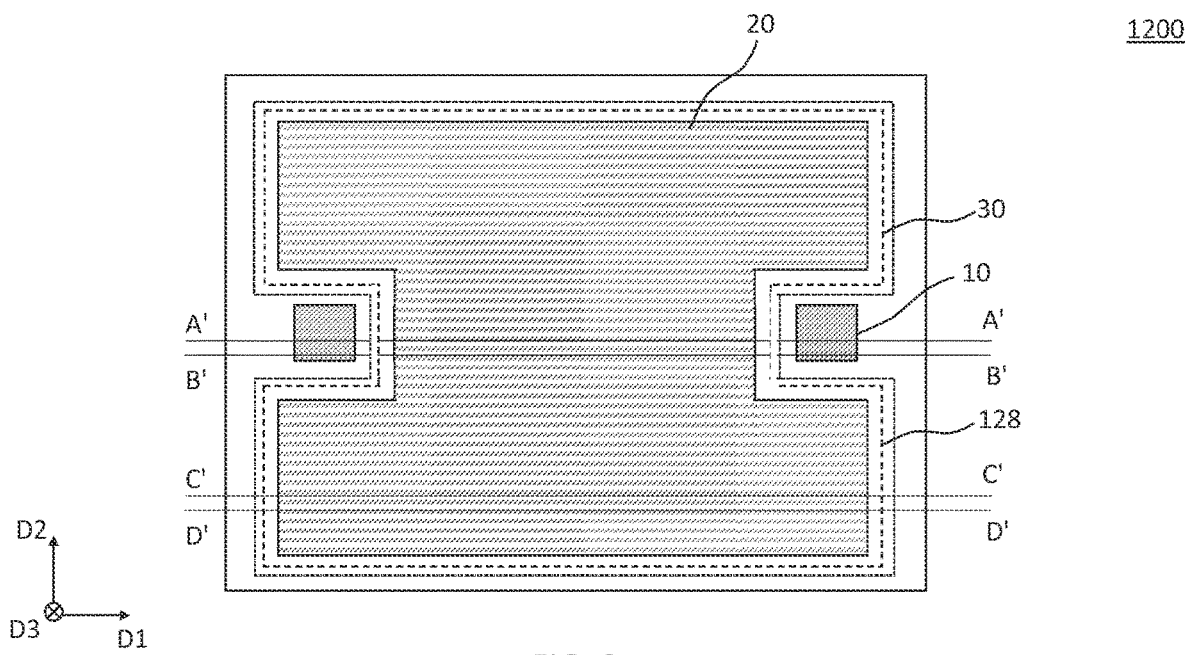
Figure 3:
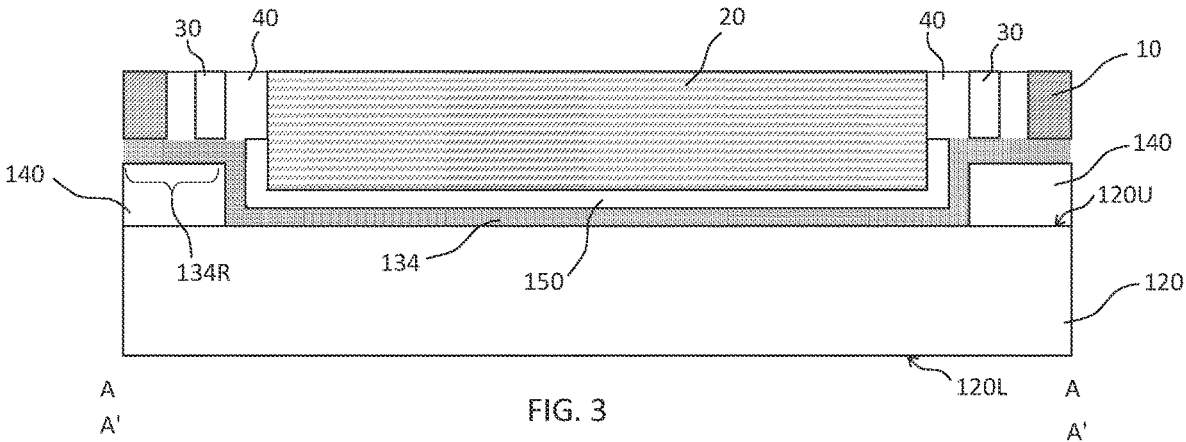
Figure 4:
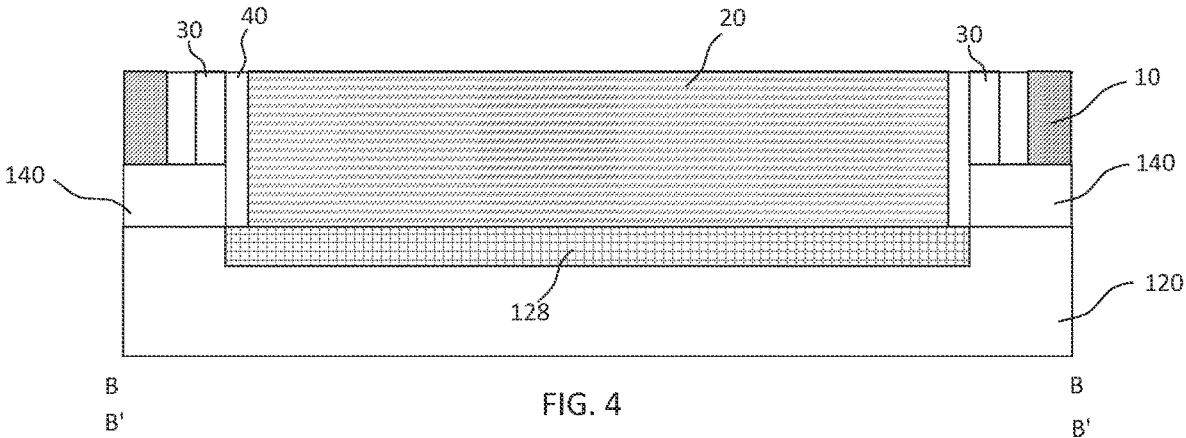
Figure 5:
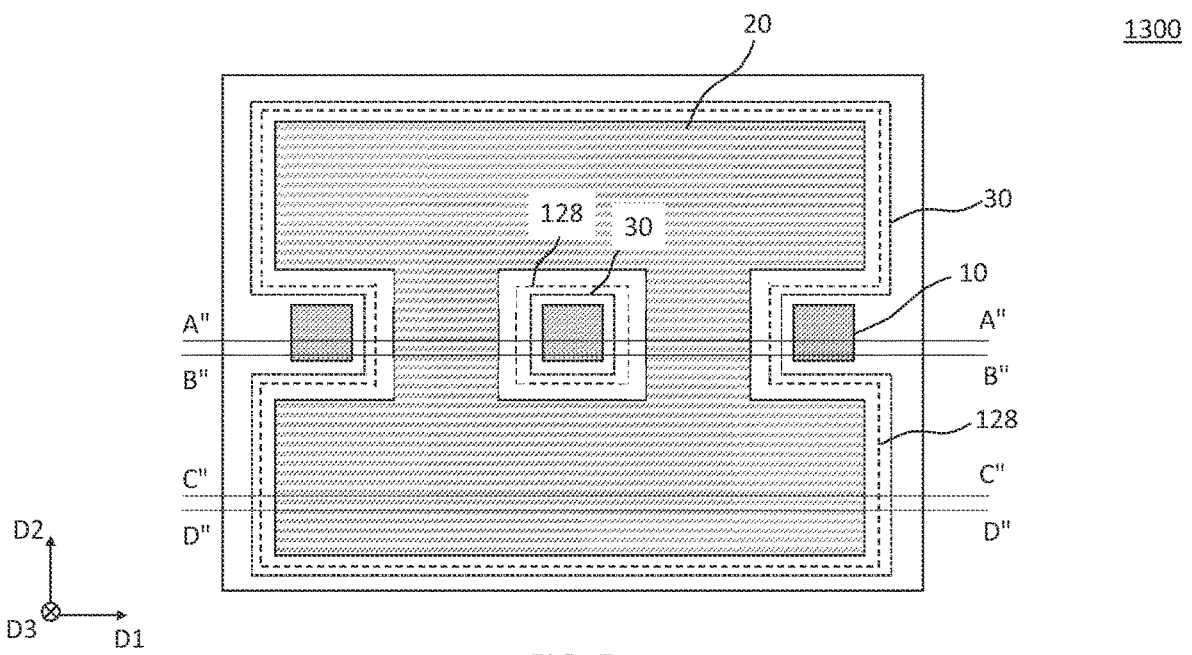
Figure 6:
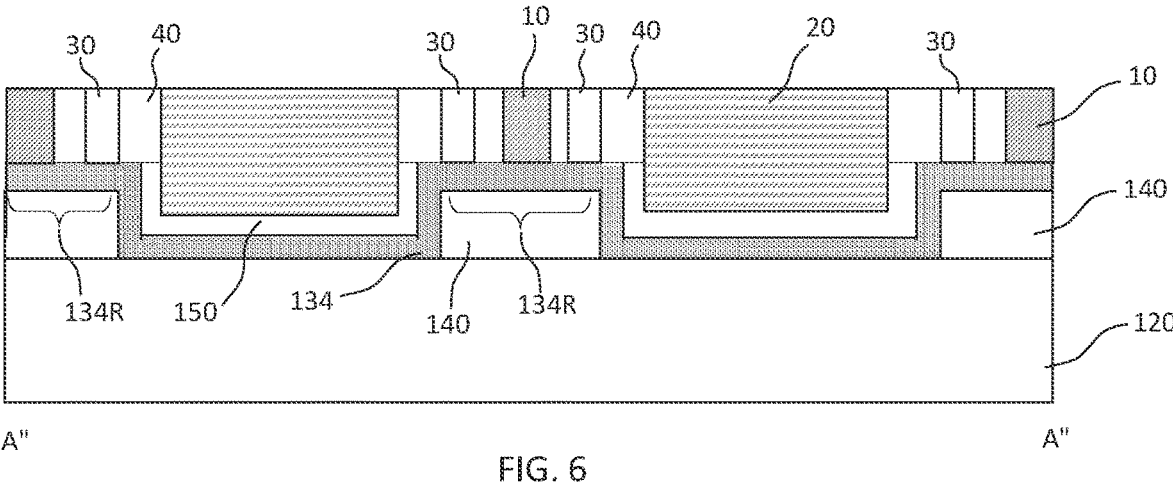
Figure 7:
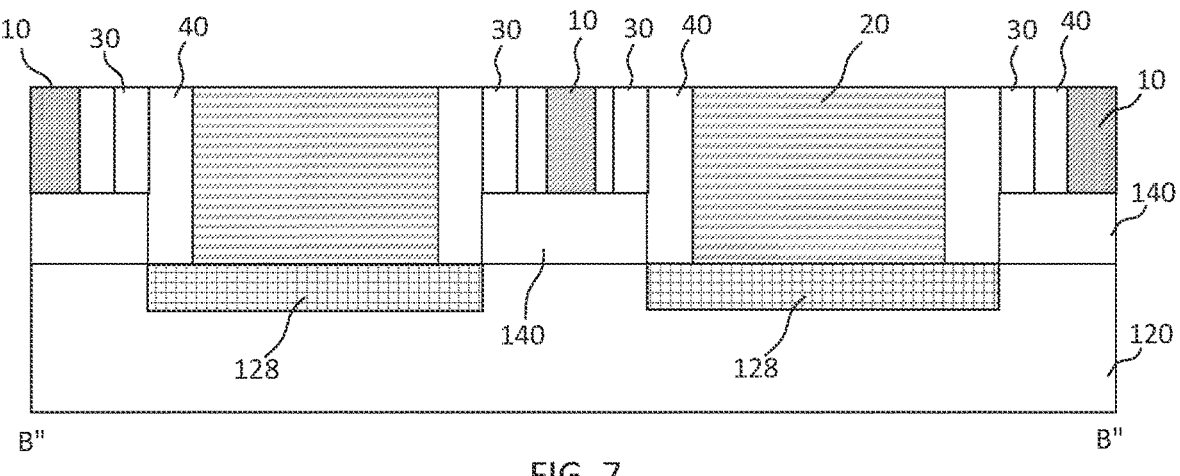
Figure 8:
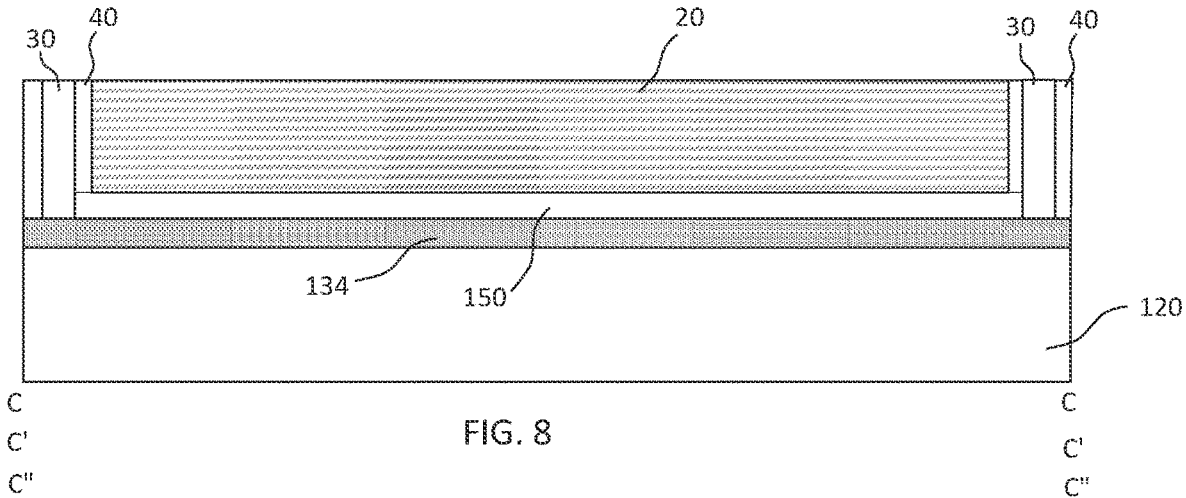
Figure 9:
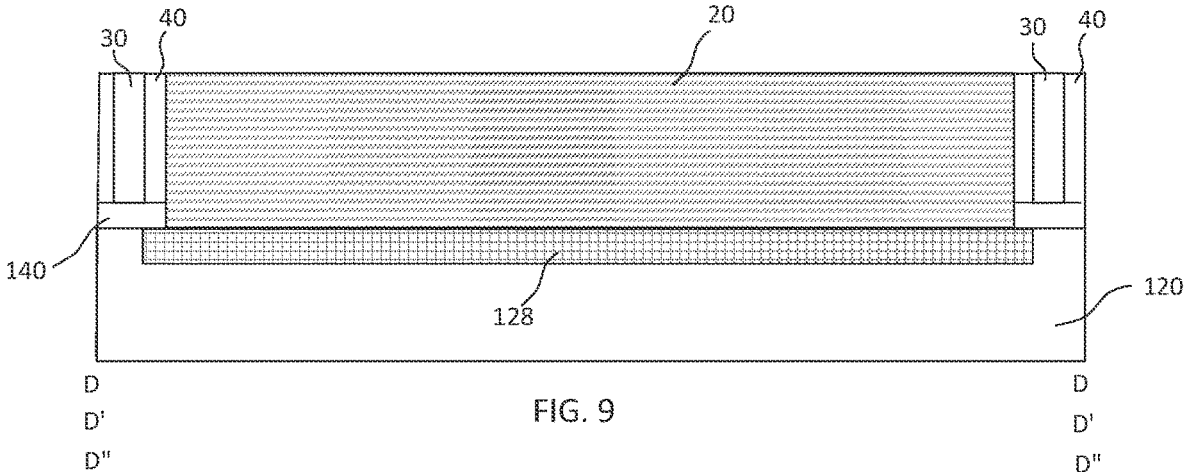

FIGS. 1, 2 and 5 are plan views of MOSFETs that include a single metal layer according to embodiments of the present invention. FIG. 1A is a cross-sectional view of the MOSFET taken along the line Z-Z in FIG. 1. FIGS. 3, 4, 6, 7, 8 and 9 are cross-sectional views of the MOSFETs in FIGS. 1, 2 and 5 according to embodiments of the present invention. Specifically, FIG. 3 is a cross-sectional view taken along the line A-A in FIG. 1 or the line A'-A' in FIG. 2, and FIG. 4 is a cross-sectional view taken along the line B-B in FIG. 1 or the line B'-B' in FIG. 2. FIG. 6 is a cross-sectional view taken along the line A"-A" in FIG. 5, and FIG. 7 is a cross-sectional view taken along the line B"-B" in FIG. 5. FIG. 8 is a cross-sectional view taken along the C-C in FIG. 1, the line C'-C' in FIG. 2 or the line C"-C" in FIG. 5, and FIG. 9 is a cross-sectional view taken along the line D-D in FIG. 1, the line D'-D' in FIG. 2 or the line D"-D" in FIG. 5. The lines A-A, A'-A', A"-A", C-C, C'-C' and C"-C" pass through a gate electrode (e.g., a gate electrode 134 in FIG.

3), and the lines B-B, B'-B', B"-B", D-D, D'-D' and D"-D" pass through a source region (e.g., a source region 128 in FIG. 4).

Referring to FIGS. 1 and 1A, the MOSFET 1100 may include a silicon carbide based semiconductor layer structure 120 (also referred to as a semiconductor layer structure) including an active region defined therein. An active region of a MOSFET device is a region in which current is conducted when the MOSFET device is in a conduction mode.

The active region may include a plurality of unit cell transistors. The semiconductor layer structure 120 may be a wide bandgap semiconductor layer structure 120 (i.e., a semiconductor layer structure 120 formed of wide bandgap semiconductor materials). The semiconductor layer structure 120 may include a substrate 122, a drift region 124, and a well region 126. The substrate 122 may be an n-type silicon carbide semiconductor substrate such as, for example, a single crystal 4H silicon carbide semiconductor substrate that is heavily-doped (e.g., between $1 \times 10^{18}$ atoms/$cm^3$ and $1 \times 10^{21}$ atoms/$cm^3$) with n-type impurities. The drift region 124 may be a lightly-doped n-type ($n^-$) silicon carbide drift region provided on an upper surface of the substrate 122. The well regions 126 may be moderately-doped p-type regions formed in upper portions of the n-type drift region 124. The semiconductor layer structure 120 may also include source regions 128. The source regions 128 may be heavily-doped ($n^+$) n-type silicon carbide source regions. The source regions 128 may be spaced apart from each other in a second direction D2.

The MOSFET 1100 may also include gate structures 160 that may be spaced apart from each other in the second direction D2. The gate structures 160 and the source regions 128 may be arranged alternately along the second direction D2 as illustrated in FIG. 1A. Each of the gate structures 160 may include a gate insulator 132, a gate electrode 134, and a gate capping layer 150 on the gate electrode 134. The gate capping layer 150 may electrically isolate the gate electrode 134 from other conductive elements. For simplicity of illustration, the gate insulator 132 may not be shown in various cross-sectional views.

Further, the MOSFET 1100 may include a source bond pad 20 on top of the semiconductor layer structure 120 and multiple gate bond pads 10 that are on top of the semiconductor layer structure 120 and are spaced apart from each other. In the MOSFET 1100, the source bond pad 20 may contact the source regions 128 and may also be referred to as a source contact. A region underneath the source contact 20 may be an active region of the MOSFET 1100.

The MOSFET 1100 may include four gate bond pads 10 (i.e., a first gate bond pad, a second gate bond pad, a third gate bond pad and a fourth gate bond pad) that are positioned above respective first, second, third and fourth corner regions of an upper surface (e.g., 120U in FIG. 3) of the semiconductor layer structure 120.

Referring to FIGS. 3, 4, 8 and 9, each of the gate electrode 134 and the source region 128 may may extend longitudinally in a first direction D1. The first direction D1 may be different from the second direction D2. The semiconductor layer structure 120 may include an upper surface 120U on which the gate electrode 134 is provided and a lower surface 120L that is opposite the upper surface 120U. The first direction D1 and the second direction D2 both may be parallel to the upper surface 120U of the semiconductor layer structure 120 and may be first and second horizontal directions, respectively. In some embodiments, the first direction D1 may be perpendicular to the second direction D2. A third direction D3 may be perpendicular to the upper surface 120U of the semiconductor layer structure 120 and may be a vertical direction.

The MOSFET 1100 may include field oxide layers 140. Each of the field oxide layers 140 may be interposed between the semiconductor layer structure 120 and a respective one of the gate bond pads 10. A gate resistor 134R that extends from the gate electrode 134 may optionally be provided on the field oxide layer 140. The gate resistor 134R may be interposed between the gate bond pad 10 and the field oxide layer 140. In some embodiments, the gate bond pad 10 may contact the gate resistor 134R such that the gate bond pad 10 may be electrically connected to the gate resistor 134R.

The MOSFET 1100 may also include a gate bus 30 that may be electrically connected to the gate bond pads 10 through the gate resistors 134R. In some embodiments, the gate bus 30 may contact the gate resistor 134R such that the gate bus 30 may be electrically connected to the gate resistor 134R. In some embodiments, the field oxide layer 140 may be interposed between the gate resistor 134R and the semiconductor layer structure 120.

Further, the MOSFET 1100 may include a source bond pad 20 that may be electrically connected to the source regions 128. The source bond pad 20 may contact the source regions 128 as illustrated in FIG. 4. The source bond pad 20 may vertically overlap the gate electrodes 134 as illustrated in FIG. 1A. The source bond pad 20 may be electrically isolated from the gate electrode 134 by the gate capping layer 150 that is interposed between the source bond pad 20 and the gate electrode 134. A dielectric layer 40 (e.g., an inter-metal dielectric layer) may be provided for electrical isolation between conductive elements (e.g., the gate bond pad 10, the source bond pad 20, and the gate bus 30). The gate bus 30 may continuously extend along an outline of the source bond pad 20 as represented with a dashed line in FIG. 1, or may comprise multiple discontinuous segments.

In some embodiments, the gate bond pad 10, the source bond pad 20 and/or the gate bus 30 may be formed concurrently by the same processes. For example, a conductive layer (e.g., a metal layer) may be formed on the gate structures 160 and then the conductive layer may be patterned to form the gate bond pad 10, the source bond pad 20 and/or the gate bus 30. Accordingly, the gate bond pad 10, the source bond pad 20 and/or the gate bus 30 may include respective portions of the conductive layer. In some embodiments, upper surfaces of the gate bond pad 10 and the source bond pad 20 may be coplanar with each other as illustrated in FIGS. 3 and 4.

Referring to FIGS. 8 and 9, in the area where the gate bond pads 10 are not provided, the gate resistor 134R may be omitted, and the gate bus 30 may contact the gate electrode 134 and the field oxide layer 140.

Referring to FIGS. 2 and 5, a MOSFET 1200 in FIG. 2 and a MOSFET 1300 are similar to the MOSFET 1100 in FIG. 1 with a primary difference being that each of the MOSFETs 1200 and 1300 includes different numbers of gate bond pads 10 at different locations.

Referring to FIGS. 2 and 5, each of the MOSFETs 1200 and 1300 may include a first gate bond pad 10 that is adjacent a first side of the semiconductor layer structure 120 and a second gate bond pad 10 that is adjacent a second side of the semiconductor layer structure 120. The first side may be opposite the second side. In some embodiments, the first and second gate bond pads 10 may each be positioned about midway between a third side of the semiconductor layer structure 120 and a fourth side of the semiconductor layer structure 120, where the fourth side is opposite the third side when the MOSFET is viewed from above as illustrated in FIGS. 2 and 5.

The MOSFET 1300 may further include a third gate bond pad 10 between the first and second gate bond pads 10. In some embodiments, the third gate bond pad 10 may be positioned above a center of the upper surface 120U of the semiconductor layer structure 120 as illustrated in FIG. 5.

FIGS. 6 and 7 are cross-section views of the MOSFET 1300 taken along the lines A"-A" and B"-B" in FIG. 5. The cross-section views of the MOSFET 1300 illustrated in FIGS. 6 and 7 are similar to the cross-sectional views illustrated in FIGS. 3 and 4 with primary differences being that a field oxide layer 140, a gate resistor 134R and a gate bus 30 are additionally provided adjacent the third gate bond pad 10 that is positioned about midway between opposing sides of the upper surface 120U of the semiconductor layer structure 120, and portions of the source bond pad 20 are provided on opposing sides of the third gate bond pad 10. The field oxide layer 140 and the gate resistor 134R may be provided between the third gate bond pad 10 and the semiconductor layer structure 120, and the gate bus 30 may be provided on the gate resistor 134R and the field oxide layer. In some embodiment, the gate bus 30 may enclose the third gate bond pad 10 when the MOSFET is viewed from above.

Figure 10:
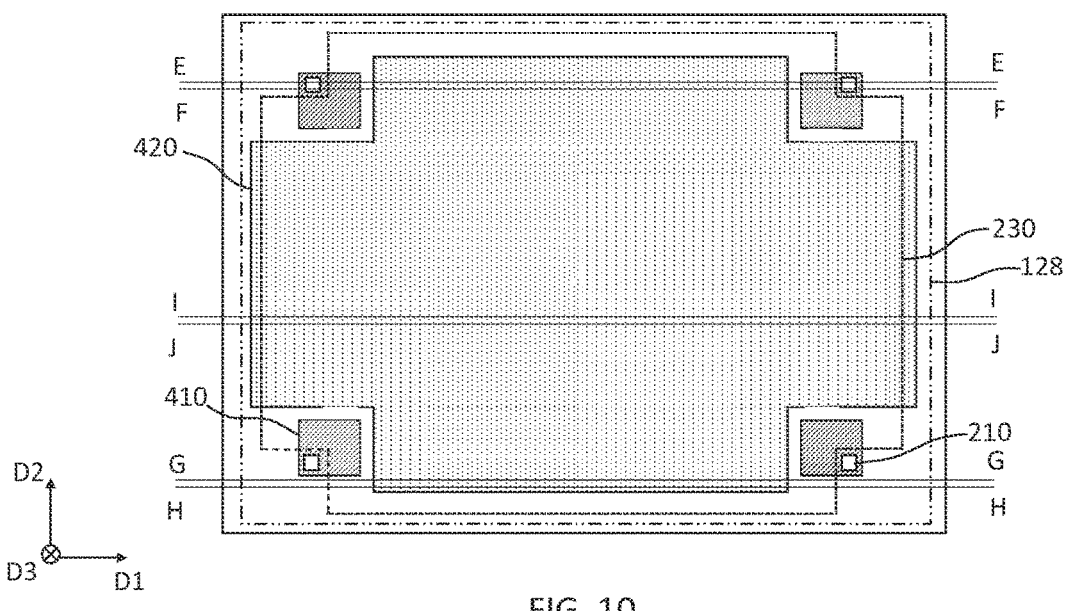
FIGS. 10, 11 and 16 are plan views of MOSFETs that include double metal layers according to embodiments of the present invention.
Figure 11:
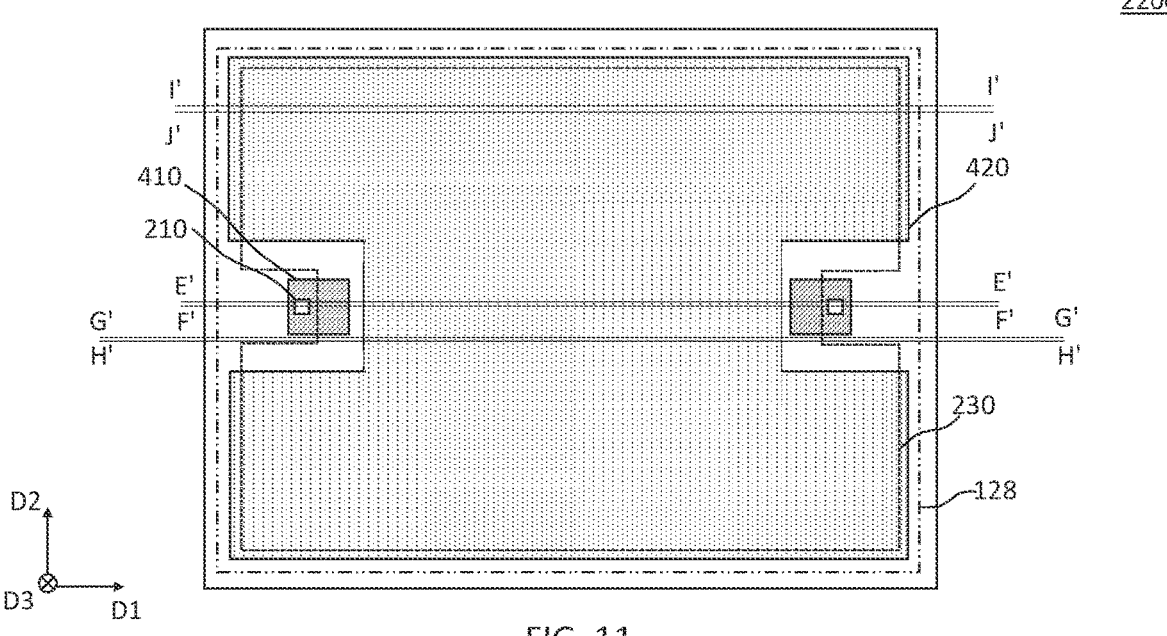
Figure 12:
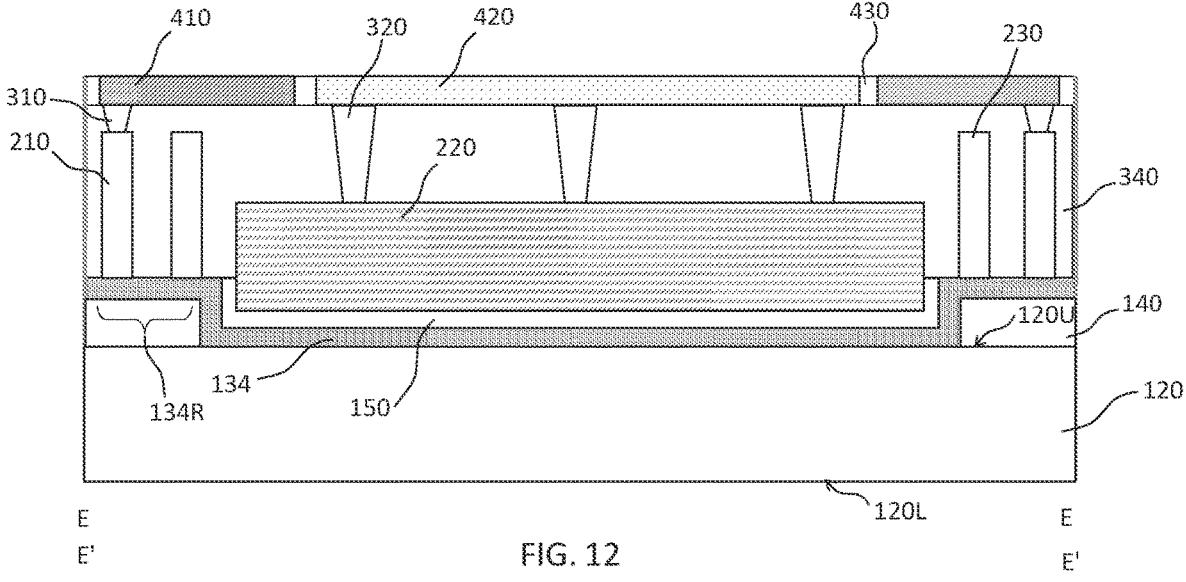
FIGS. 12, 13, 14, 15, 17, 18, 19 and 20 are cross-sectional views of the MOSFETs in FIGS. 10, 11 and 16 according to embodiments of the present invention.
Figure 13:
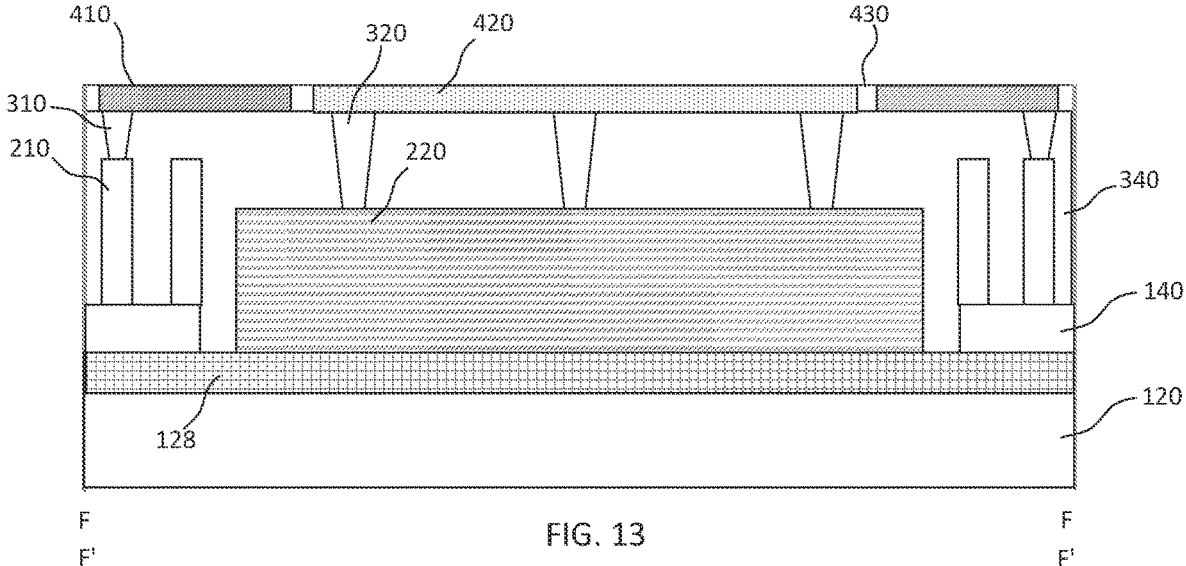
Figure 14:
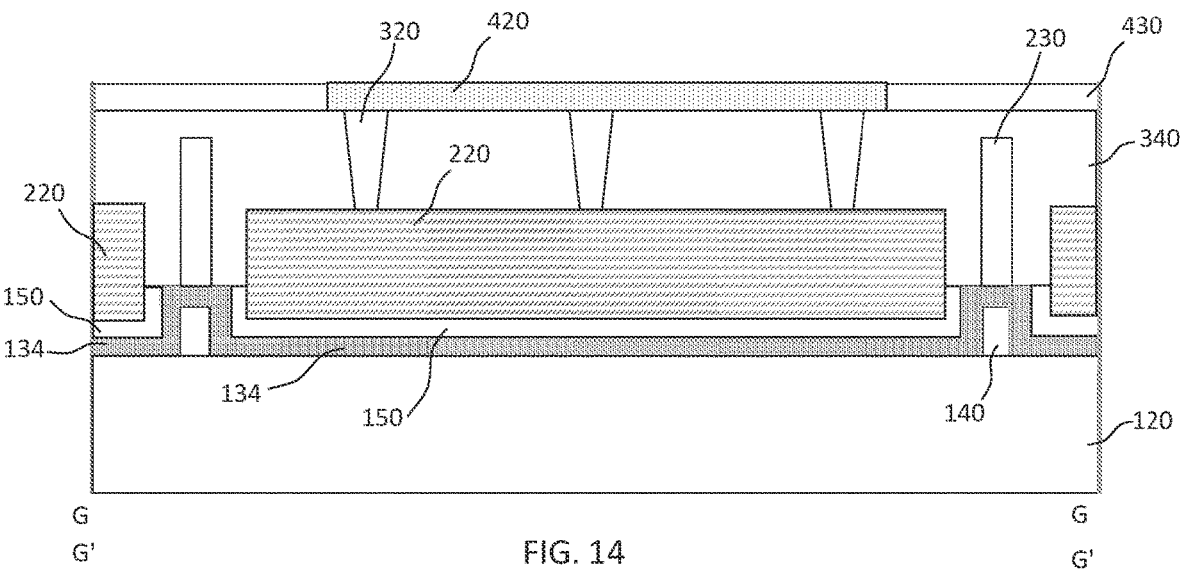
Figure 15:
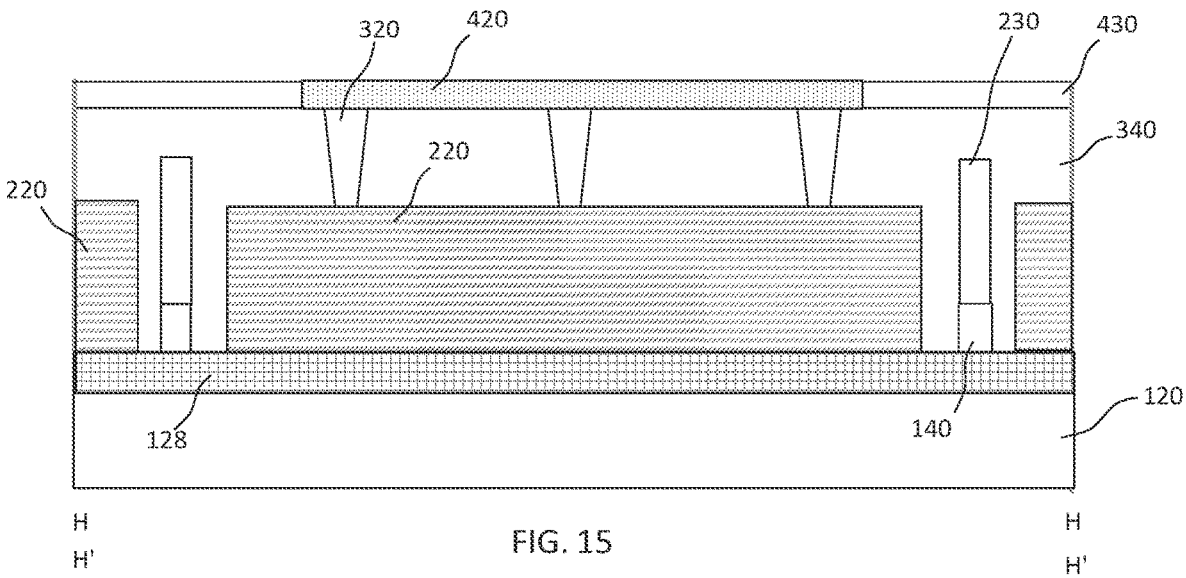
Figure 16:
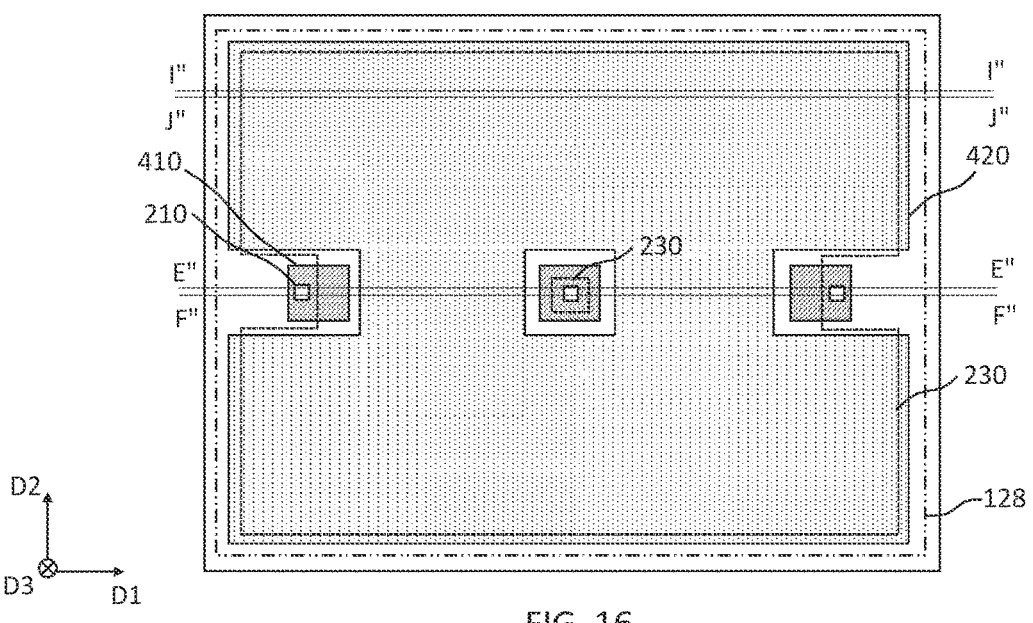
Figure 17:
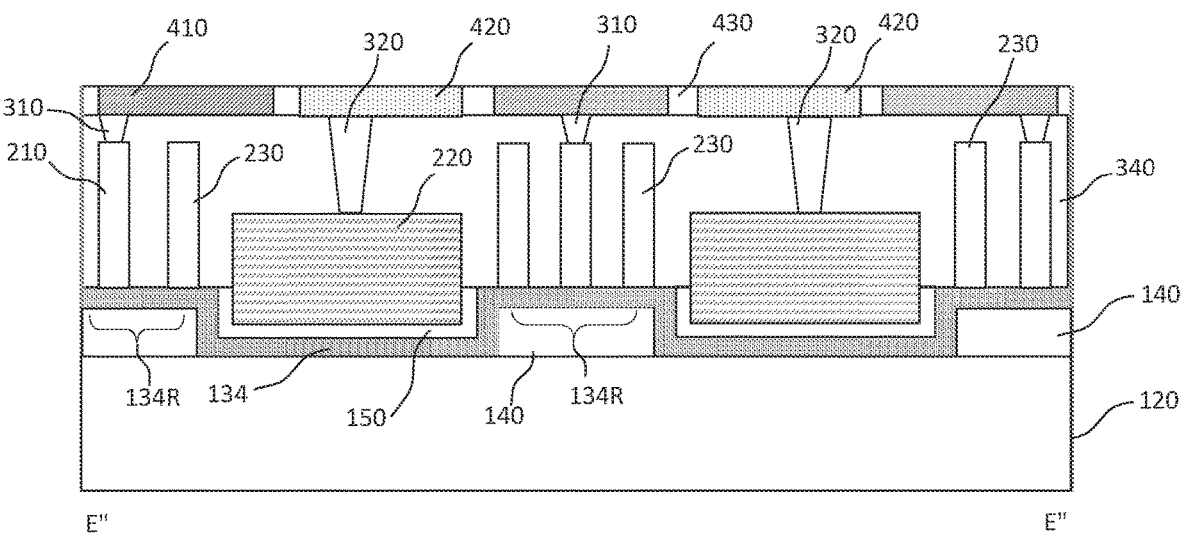
Figure 18:
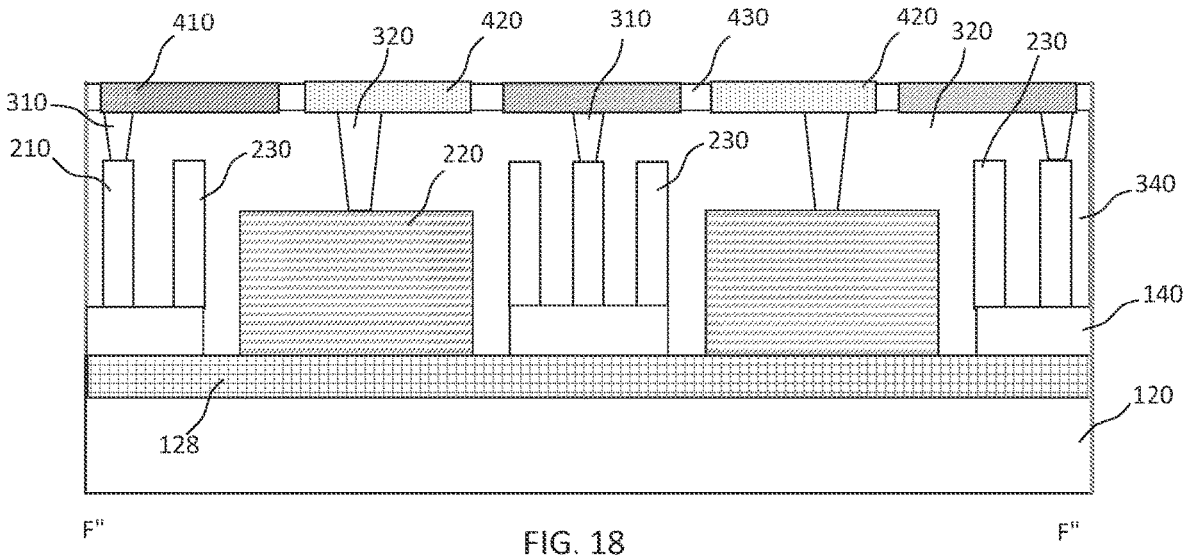
Figure 19:
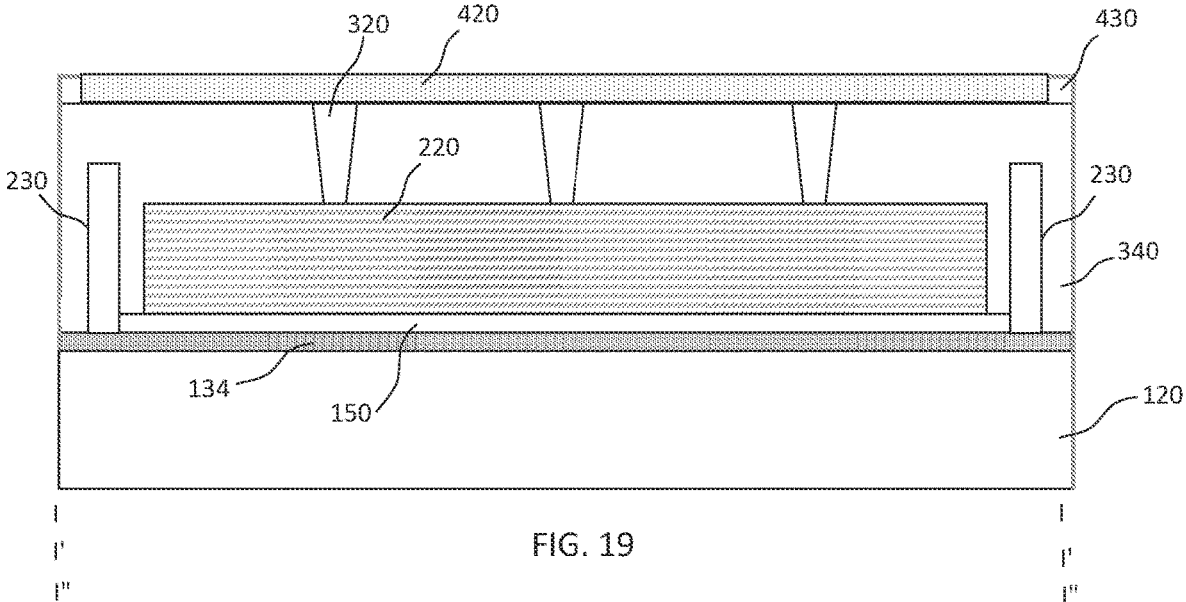
Figure 20:
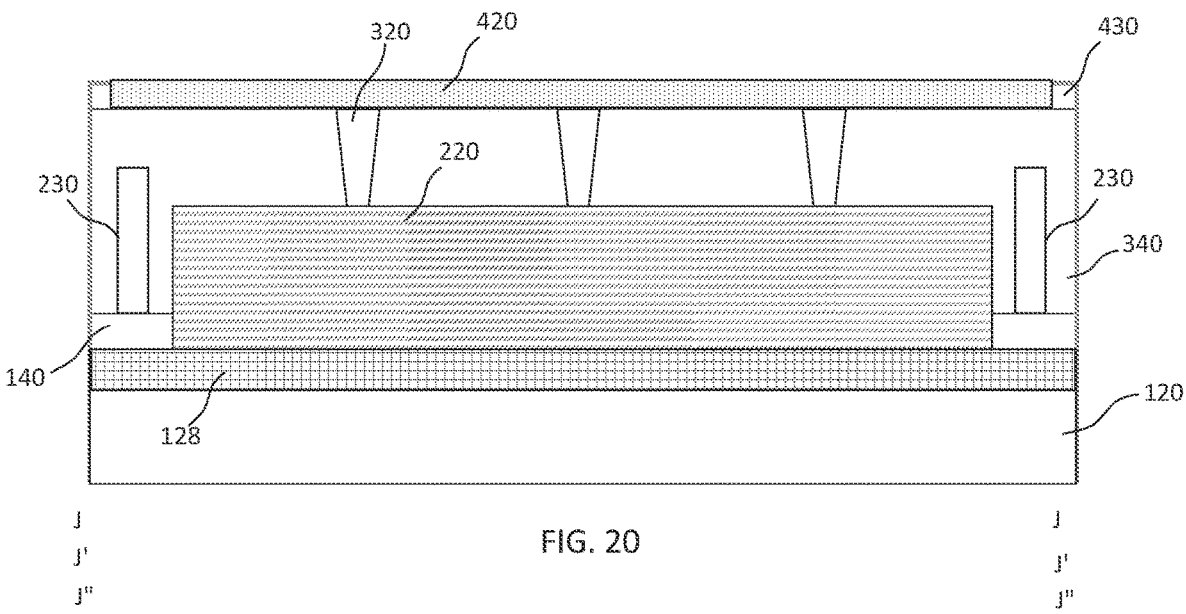

FIGS. 10, 11 and 16 are plan views of MOSFETs that include double metal layers according to embodiments of the present invention. FIGS. 12, 13, 14, 15, 17, 18, 19 and 20 are cross-sectional views of the MOSFETs illustrated in FIGS. 10, 11 and 16 according to embodiments of the present invention. Specifically, FIG. 12 is a cross-sectional view taken along the line E-E in FIG. 10 or the line E'-E' in FIG. 11, FIG. 13 is a cross-sectional view taken along the line F-F in FIG. 10 or the line F'-F' in FIG. 11, FIG. 14 is a cross-sectional view taken along the line G-G in FIG. 10 or the line G'-G' in FIG. 11, and FIG. 15 is a cross-sectional view taken along the line H-H in FIG. 10 or the line H'-H' in FIG. 11. FIG. 17 is a cross-sectional view taken along the line E"-E" in FIG. 16, and FIG. 18 is a cross-sectional view taken along the line F"-F" in FIG. 16. FIG. 19 is a cross-sectional view taken along the I-I in FIG. 10, the line I'-I' in FIG. 11 or the line I"-I" in FIG. 16, and FIG. 20 is a cross-sectional view taken along the J-J in FIG. 10, the line J'-J' in FIG. 11 or the line J"-J" in FIG. 16. The lines E-E, E'-E', E"-E", G-G, G'-G', I-I, I'-I', and I"-I" pass through a gate electrode (e.g., a gate electrode 134 in FIG. 12), and the lines F-F, F'-F', F"-F", H-H, H'-H', J-J, J'-J', and J"-J" pass through a source region (e.g., a source region 128 in FIG. 13).

Referring to FIGS. 10, 12 through 15, 19 and 20, the MOSFET 2100 may include a semiconductor layer structure 120 including an active region defined therein and a gate bond pad that is on top of the semiconductor layer structure 120 and vertically overlaps the active region. The MOSFET 2100 may also include double metal layers including a lower metal layer (also referred to as a first metallization layer) and an upper metal layer (also referred to as a second metallization layer). The lower metal layer may include, for example, a source contact 220 and a gate bus 230, and the upper metal layer may include, for example, a gate bond pad 410 and a source bond pad 420. A dielectric layer 340 (also referred to as a second dielectric layer) may be provided on the lower metal layer. The dielectric layer 340 may cover the source contact 220 and the gate bus 230. A portion of the semiconductor layer structure 120 underneath the source contact 220 may be the active region.

The source contact 220 is electrically connected to the source regions 128 and may be provided on the upper surface 120U of the semiconductor layer structure 120. The source contact 220 may extend underneath the gate bond pad 410, and the gate bond pad 410 may vertically overlap the source contact 220.

The source contact 220 and the gate bond pad 410 are provided at different levels from an upper surface 120U of the semiconductor layer structure 120, and the gate bond pad 410 may vertically overlap an active region. In some embodiments, more than half the gate bond pad 410 may vertically overlap the active region.

The gate bond pad 410 and the source bond pad 420 may be provided at the same height from the upper surface 120U of the semiconductor layer structure 120. A passivation layer 430 may be provided to electrically isolate the gate bond pad 410 and the source bond pad 420.

A conductive gate connector 210 electrically connected to a gate resistor 134R may be provided on the gate resistor 134R. The conductive gate connector 210 may contact the gate resistor 134R. A gate bus 230 electrically connected to the conductive gate connector 210 may be provided on the gate resistor 134R. The gate bus 230 may contact the gate resistor 134R and may be electrically connected to the conductive gate connector 210 through the gate resistor 134R. A field oxide layer 140 may be interposed between the semiconductor layer structure 120 and the gate resistor 134R and between the semiconductor layer structure 120 and the conductive gate connector 210. The portions of the source regions 128 underneath the field oxide layer 140 may have the opposite conductivity type (e.g., p-type) than the remainder of the source regions 128 (which may be n-type) to form a p-type guard ring. The gate bond pad 410 may vertically overlap the conductive gate connector 210, the gate resistor 134R and the field oxide layer 140. The MOSFET 2100 may include multiple conductive gate connectors 210, multiple gate resistors 134R and multiple field oxide layer 140.

The dielectric layer 340 may electrically isolate conductive elements (e.g., the conductive gate connector 210, the source contact 220 and the gate bus 230) from each other. The MOSFET 2100 may further include a first conductive via 310 and a second conductive via 320 that are provided in the dielectric layer 340. In some embodiments, the first conductive via 310 and the second conductive via 320 may extend through the dielectric layer 340. The first conductive via 310 may electrically connect the gate bond pad 410 to the conductive gate connector 210. In some embodiments, the first conductive via 310 may contact the gate bond pad 410 and the conductive gate connector 210. The second conductive via 320 may electrically connect the source bond pad 420 to the source contact 220. In some embodiments, the second conductive via 320 may contact the source bond pad 420 and the source contact 220.

Referring to FIGS. 14 and 15, the field oxide layer 140 may have a narrow width in the area where the conductive gate connector 210 and the gate resistor 134R are not provided. Accordingly, a portion of the source contact 220 may be provided outside of the gate bus 230, and a portion of the semiconductor layer structure 120 below that portion of the source contact 220 can be used as an active region.

In some embodiments, the conductive gate connector 210, the source contact 220 and/or the gate bus 230 may be formed concurrently by the same processes. For example, a first conductive layer (e.g., a first metal layer) may be formed on the gate structures and then the first conductive layer may be patterned to form the conductive gate connector 210, the source contact 220 and/or the gate bus 230.

Accordingly, the conductive gate connector 210, the source contact 220 and/or the gate bus 230 may include respective portions of the first conductive layer.

In some embodiments, the gate bond pad 410 and the source bond pad 420 may be formed concurrently by the same processes. For example, a second conductive layer (e.g., a second metal layer) may be formed on the dielectric layer 340 and then the second conductive layer may be patterned to form the gate bond pad 410 and the source bond pad 420. Accordingly, the gate bond pad 410 and the source bond pad 420 may include respective portions of the second conductive layer. In some embodiments, top surfaces of the gate bond pad 410 and the source bond pad 420 may be coplanar with each other, and the gate bond pad 410 and the source bond pad 420 may have the same thicknesses in the third direction D3.

Referring to FIGS. 19 and 20, in the area where the gate bond pads 410 are not provided, the gate resistor 134R may be omitted, and the gate bus 230 may contact the gate electrode 134 and the field oxide layer 140.

Referring to FIGS. 10 and 12, the MOSFET 2100 may include four gate bond pads 410 (i.e., a first gate bond pad, a second gate bond pad, a third gate bond pad and a fourth gate bond pad) that are positioned above respective first, second, third and fourth corner regions of the upper surface 120U of the semiconductor layer structure 120.

The MOSFET 2200 in FIG. 11 and the MOSFET 2300 in FIG. 16 are similar to the MOSFET 2100 in FIG. 10 with a primary difference being that the MOSFETs 2200 and 2300 include different numbers of gate bond pads 410 at different locations.

Referring to FIGS. 11 and 16, the each of the MOSFETs 2200 and 2300 may include a first gate bond pad 410 that is adjacent a first side of the semiconductor layer structure 120 and a second gate bond pad 410 that is adjacent a second side of the semiconductor layer structure 120. The first side may be opposite the second side. In some embodiments, the first and second gate bond pads 410 may each positioned about midway between a third side of the semiconductor layer structure 120 and a fourth side of the semiconductor layer structure 120, where the fourth side is opposite the third side when the semiconductor device is viewed from above as illustrated in FIGS. 11 and 16.

The MOSFET 2300 may further include a third gate bond pad 410 between the first and second gate bond pads 410. In some embodiments, the third gate bond pad 410 may be positioned above a center of the upper surface 120U of the semiconductor layer structure 120 as illustrated in FIG. 16.

FIGS. 17 and 18 are cross-section views of the MOSFET 2300 taken along the lines E″-E″ and F″-F″ in FIG. 16. The cross-section views of the MOSFET 2300 illustrated in FIGS. 17 and 18 are similar to the cross-sectional views illustrated in FIGS. 12 and 13 with primary differences being that a field oxide layer 140, a gate resistor 134R and a gate bus 230 are additionally provided adjacent the third gate bond pad 410 that is positioned about midway between opposing sides of the upper surface 120U of the semiconductor layer structure 120, and portions of the source contact 220 are provided on opposing sides of the field oxide layer 140. The field oxide layer 140 and the gate resistor 134R may be interposed between the third gate bond pad 410 and the semiconductor layer structure 120, and the gate bus 230 may be provided on the gate resistor 134R. In some embodiment, the gate bus 230 may enclose the third gate bond pad 410 when the MOSFET is viewed from above. The gate bond pads 410 may vertically overlap the active region of the semiconductor layer structure 120, which is below the source contact 220.

Figure 21:
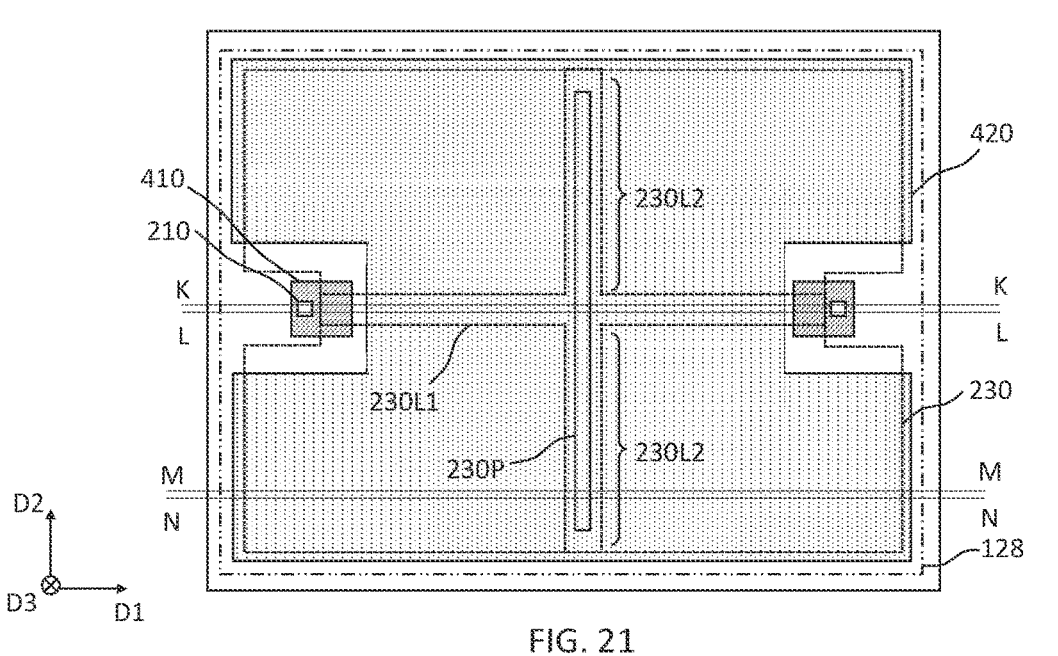
FIGS. 21 and 22 are plan views of MOSFETs according to further embodiments of the present invention.
Figure 22:
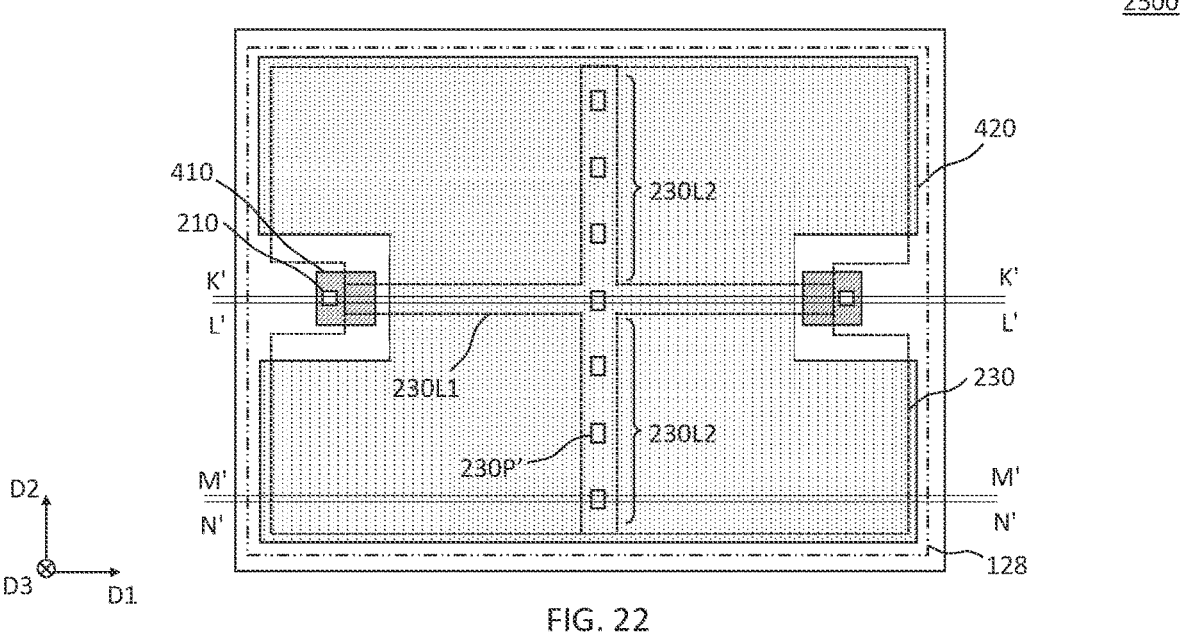
Figure 23:
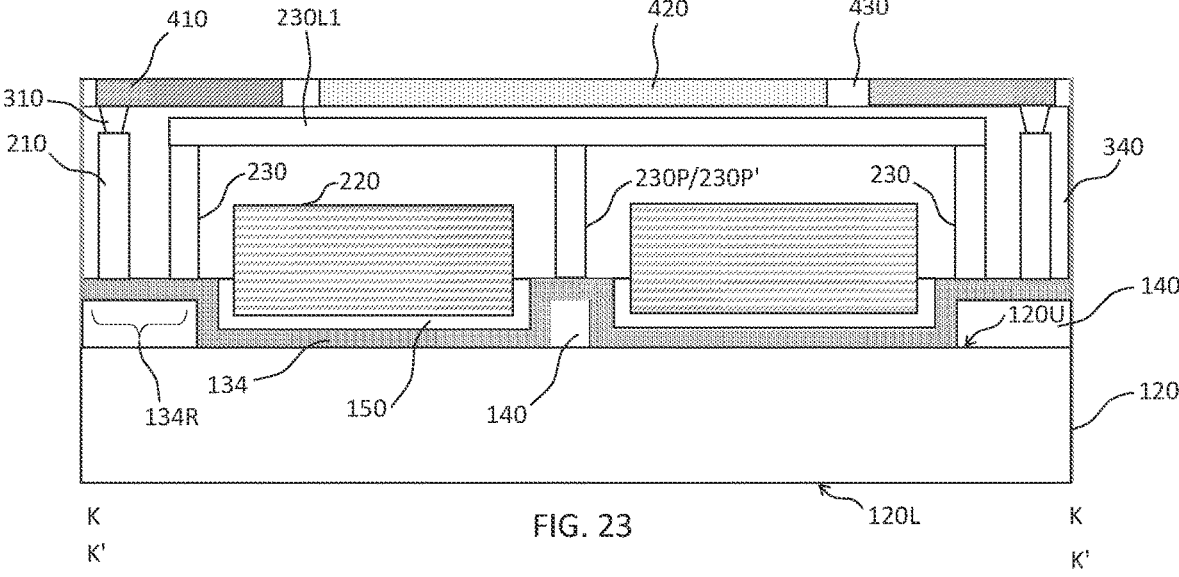
FIGS. 23, 24, 25 and 26 are cross-sectional views of the MOSFETs in FIGS. 21 and 22 according to embodiments of the present invention.
Figure 24:
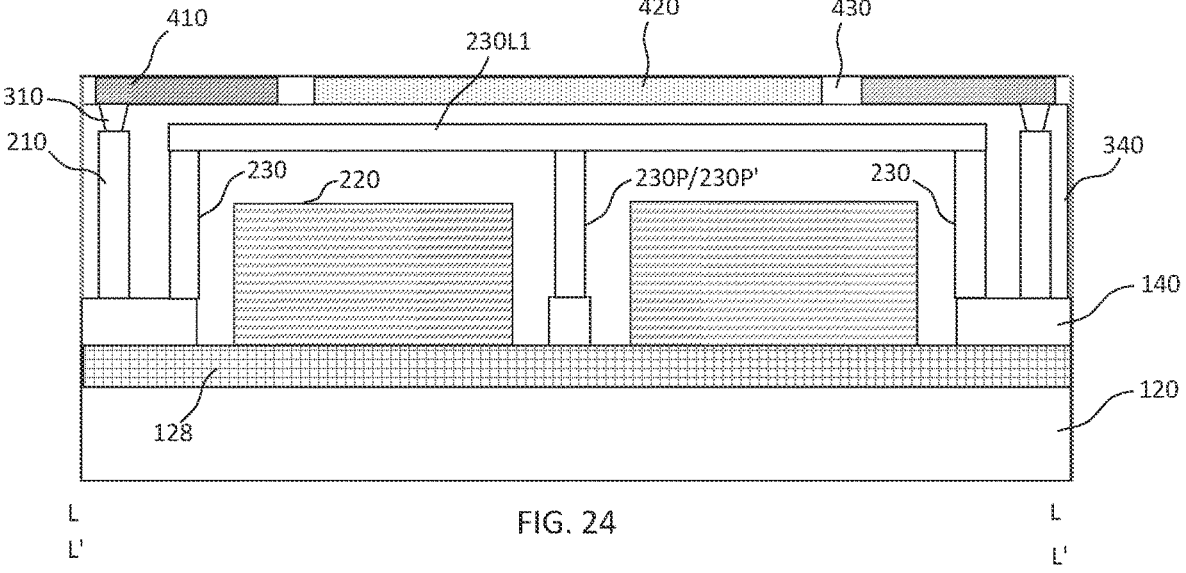
Figure 25:
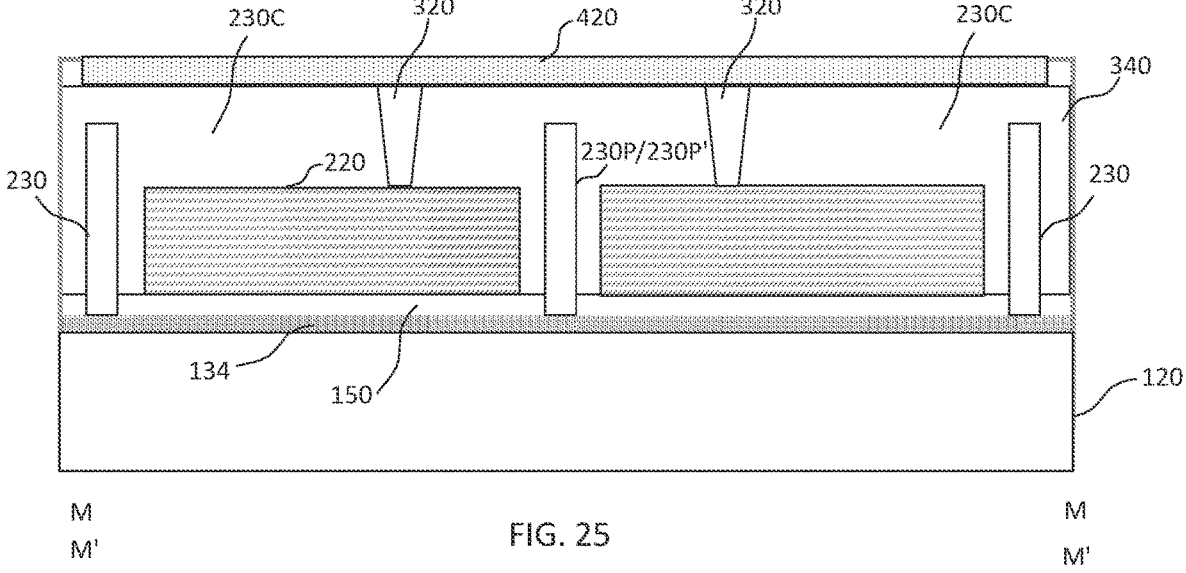
Figure 26:
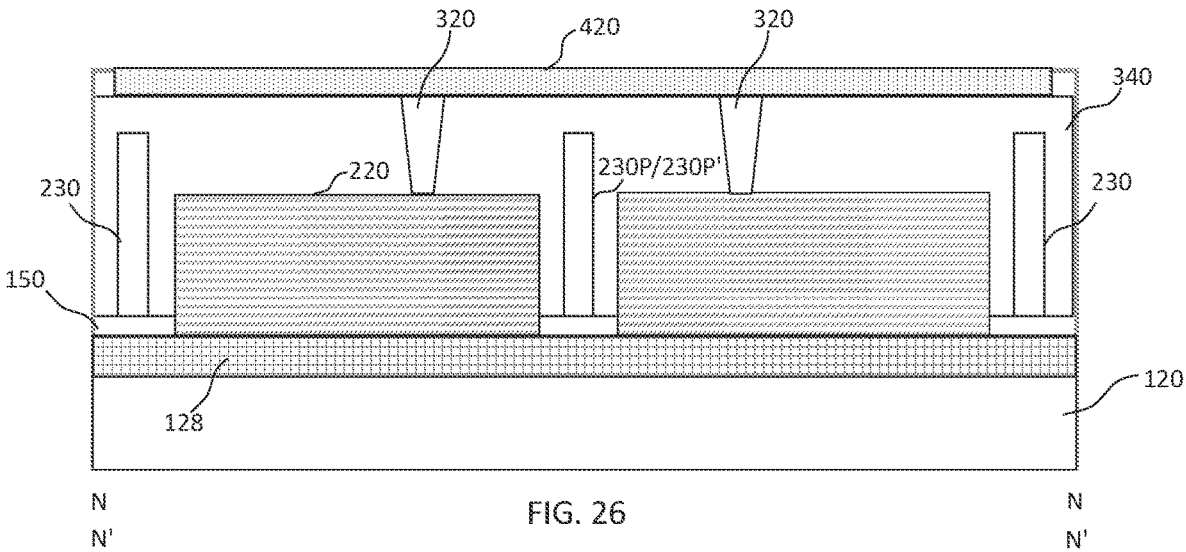

FIGS. 21 and 22 are plan views of MOSFETs according to further embodiments of the present invention. FIGS. 23, 24, 25 and 26 are cross-sectional views of the MOSFETs in FIGS. 21 and 22 according to embodiments of the present invention. Specifically, FIG. 23 is a cross-sectional view taken along the line K-K in FIG. 21 or the line K'-K' in FIG. 22, FIG. 24 is a cross-sectional view taken along the line L-L in FIG. 21 or the line L'-L' in FIG. 22, FIG. 25 is a cross-sectional view taken along the line M-M in FIG. 21 or the line M'-M' in FIG. 22, and FIG. 26 is a cross-sectional view taken along the line N-N in FIG. 21 or the line N'-N' in FIG. 22. The lines K-K, K'-K', M-M and M'-M' pass through a gate electrode (e.g., a gate electrode 134 in FIG. 23), and the lines L-L, L'-L', N-N and N'-N' pass through a source region (e.g., a source region 128 in FIG. 24).

Referring to FIGS. 21 through 26, the MOSFETs 2400 and 2500 in FIGS. 21 and 22 are similar to the MOSFET 2200 in FIG. 11 with a primary difference being that a first gate bus connector 230L1, a second gate bus connector 230L2, and a conductive gate bus plug 230P or 230P' are additionally provided. The first and second gate bus connectors 230L1, 230L2 are conductive structures that electrically connect the gate bus 230 to the conductive gate bus plugs 230P/230P' plugs. As shown in FIGS. 21-23, the first and second gate bus connectors 230L1, 230L2 may be implemented as metal segments that extend above the source contact 220. The first and second gate bus connectors 230L1 and 230L2, the conductive gate bus plug 230P or 230P' and the gate bus 230 may be all electrically connected to each other and may collectively form a gate bus structure. The gate bus structure may include portions disposed at different height from the upper surface 120U of the semiconductor layer structure 120. For example, the first and second gate bus connectors 230L1 and 230L2 may be provided at a level higher than a level at which the gate bus 230 is provided.

The first gate bus connector 230L1 may extend longitudinally in the first direction D1 and may be on top of one or more portions of the gate bus 230. The second gate bus connector 230L2 may extend longitudinally in the second direction D2 and may also be on top of one or more portions of the gate bus 230. The gate bus 230 and the first and second gate bus connectors 230L1 and 230L2 may be provided at a level lower than a level at which the gate bond pad 410 is provided. Accordingly, the gate bond pad 410 may vertically overlap the gate bus 230 and the first and second gate bus connectors 230L1 and 230L2.

Each of the first and second gate bus connectors 230L1 and 230L2 may vertically overlap the source contact 220. The source contact 220 may be electrically connected to multiple source regions 128 in the active region. In some embodiments, the first gate bus connector 230L1 may traverse a portion of the source contact 220 as illustrated in FIGS. 21 and 22. The dielectric layer 340 may be interposed between the source contact 220 and the first and second gate bus connectors 230L1 and 230L2.

The conductive gate bus plug 230P may protrude from the first and second gate bus connectors 230L1 and 230L2 toward the gate electrode 134 and may contact the first gate electrode 134. In some embodiments, the conductive gate bus plug 230P may have a linear shape and may extend longitudinally in the second direction D2 as illustrated in FIG. 21. In some embodiments, the conductive gate bus plug 230P' may include multiple conductive gate bus plugs 230P' that are spaced apart from each other in the second direction D2 as illustrated in FIG. 22. The conductive gate bus plugs 230P' may contact respective gate electrodes 134. The conductive gate bus plug 230P and 230P' may be provided in the dielectric layer 340. The first and second gate bus connectors 230L1 and 230L2 may be at a level different from a level at which the conductive gate bus plug 230P and 230P' are provided. The conductive gate bus plug 230P and 230P' may be at a level lower than a level of the first and second gate bus connectors 230L1 and 230L2. In some embodiments, upper surfaces of the first and second gate bus connectors 230L1 and 230L2 may be higher than upper surfaces of the conductive gate bus plug 230P and 230P'.

Referring to FIGS. 23 and 24, the field oxide layer 140 may be provided between the semiconductor layer structure 120 and the conductive gate bus plug 230P or 230P', and the conductive gate bus plug 230P or 230P' may vertically overlap the field oxide layer 140. The conductive gate bus plug 230P may contact multiple gate electrodes 134. The conductive gate bus plugs 230P' may contact respective multiple gate electrodes 134.

Referring to FIGS. 25 and 26, the second gate bus connector 230L2 may vertically overlap the conductive gate bus plug 230P or at least one of the conductive gate bus plugs 230P'.

Referring to FIGS. 21 and 22, each of the MOSFETs 2400 and 2500 may include a first gate bond pad 410 that is adjacent a first side of the semiconductor layer structure 120 and a second gate bond pad 410 that is adjacent a second side of the semiconductor layer structure 120. The first side may be opposite the second side. The first and second gate bond pads 410 may each positioned about midway between a third side of the semiconductor layer structure 120 and a fourth side of the semiconductor layer structure 120, where the fourth side is opposite the third side when the semiconductor device is viewed from above as illustrated in FIGS. 21 and 22.

Figure 27:
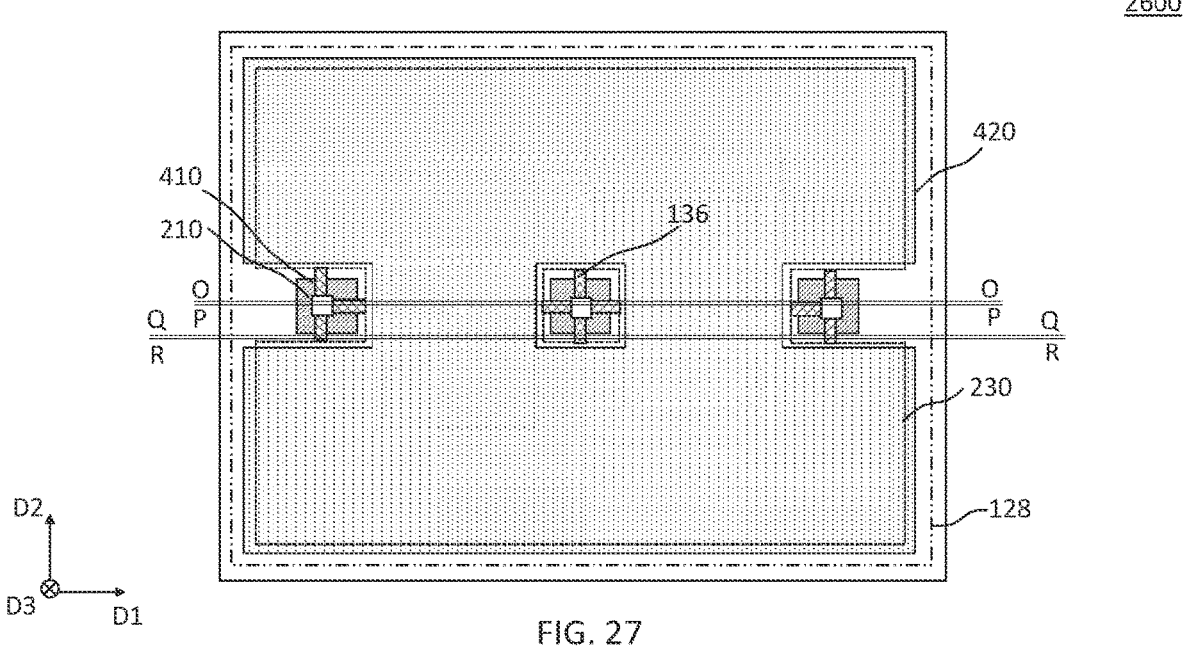
FIG. 27 is a plan view of a MOSFET including double metal layers and lumped gate resistors according to embodiments of the present invention.
Figure 28:
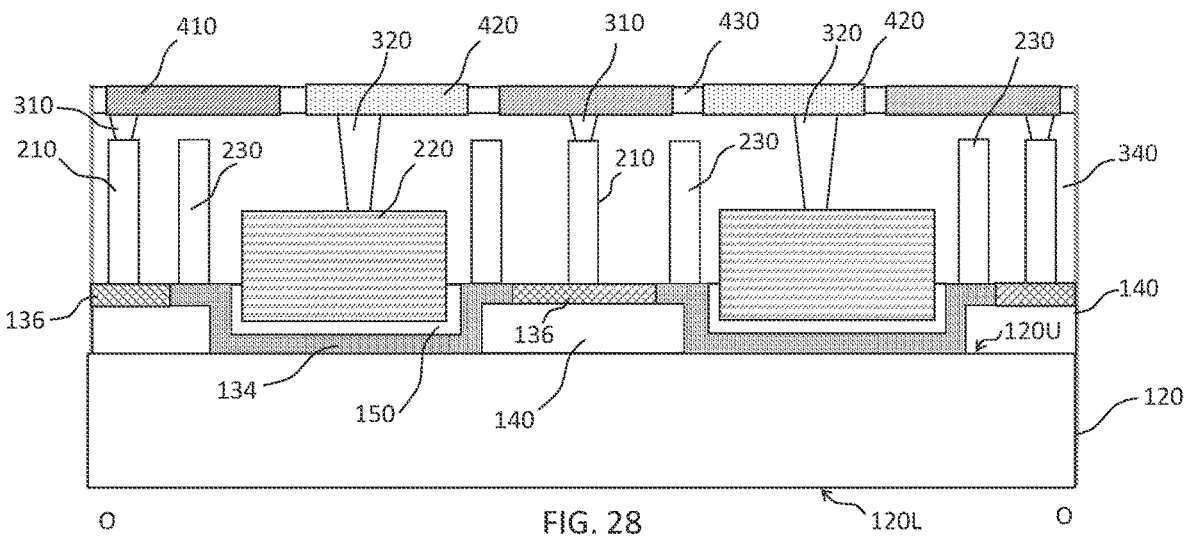
FIGS. 28, 29, 30 and 31 are cross-sectional views of the MOSFET in FIG. 27 according to embodiments of the present invention.
Figure 29:
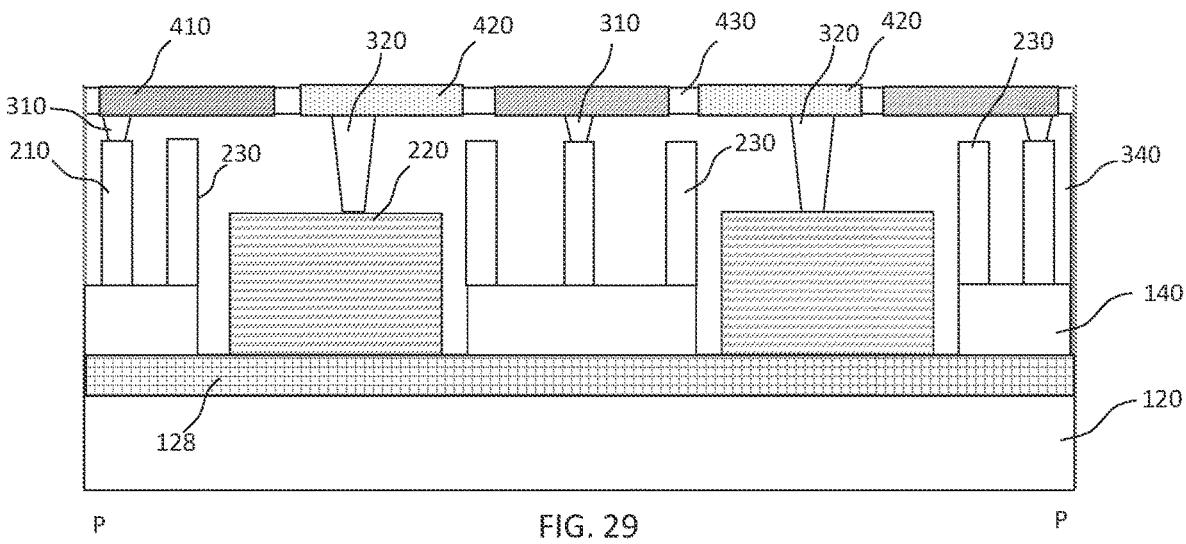
Figure 30:
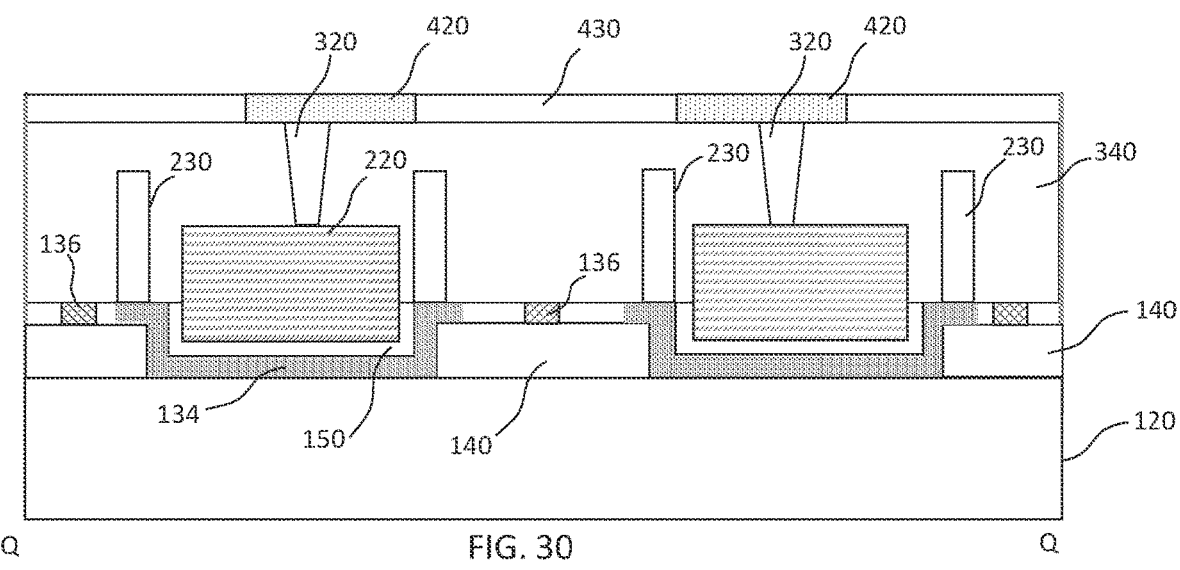
Figure 31:
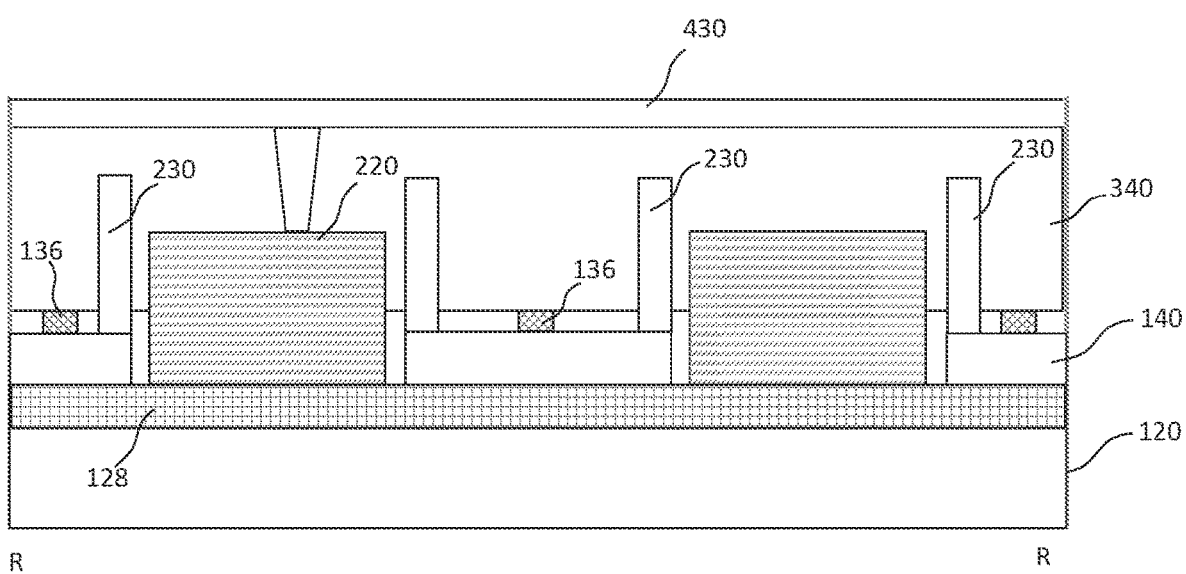

FIG. 27 is a plan view of a MOSFET 2600 including double metal layers and lumped gate resistors 136 according to embodiments of the present invention. FIGS. 28, 29, 30 and 31 are cross-sectional views of the MOSFET 2600 in FIG. 27 according to embodiments of the present invention. Specifically, FIG. 28 is a cross-sectional view taken along the line O-O in FIG. 27, FIG. 29 is a cross-sectional view taken along the line P-P in FIG. 27, FIG. 30 is a cross-sectional view taken along the line Q-Q in FIG. 27, and FIG. 31 is a cross-sectional view taken along the line R-R in FIG. 27. The lines O-O and Q-Q pass through a gate electrode (e.g., a gate electrode 134 in FIG. 28), and the lines P-P and R-R pass through a source region (e.g., a source region 128 in FIG. 29).

The MOSFET 2600 in FIG. 27 is similar to the MOSFET 2300 in FIG. 16 with a primary difference being that lumped gate resistors 136 are provided under the gate bond pads 410, respectively. Referring to FIGS. 27 through 31, the MOSFET 2600 may include lumped gate resistors 136, each of which includes a first portion extending longitudinally in the first direction D1 and a second portion extending longitudinally in the second direction D2. The second portion of the lumped gate resistor 136 may extend from one of gate electrodes 134 in the second direction D2.

The MOSFET 2600 may include two lumped gate resistors 136 (i.e., first and second lumped gate resistors) that are spaced apart from each other in the first direction D1. The first and second lumped gate resistors 136 may be above first and second sides of the semiconductor layer structure 120, respectively. The first side may be opposite the second side.

The first and second lumped gate resistors 136 may be underneath first and second gate bond pads 410, respectively, and may be electrically connected to the first and second gate bond pads 410, respectively. Each of the first and second lumped gate resistors 136 may be electrically connected to the first or second gate bond pads 410 through the conductive gate connector 210 and the first conductive via 310. The conductive gate connector 210 and the first conductive via 310, which are electrically connected to the first gate bond pad 410 and the first lumped gate resistor 136, may be underneath the first gate bond pad 410. The conductive gate connector 210 and the first conductive via 310, which are electrically connected to the second gate bond pad 410 and the second lumped gate resistor 136, may be underneath the second gate bond pad 410. The conductive gate connector 210 underneath the first gate bond pad 410 may contact the first lumped gate resistor 136, and the conductive gate connector 210 underneath the second gate bond pad 410 may contact the second lumped gate resistor 136.

Figure 32:
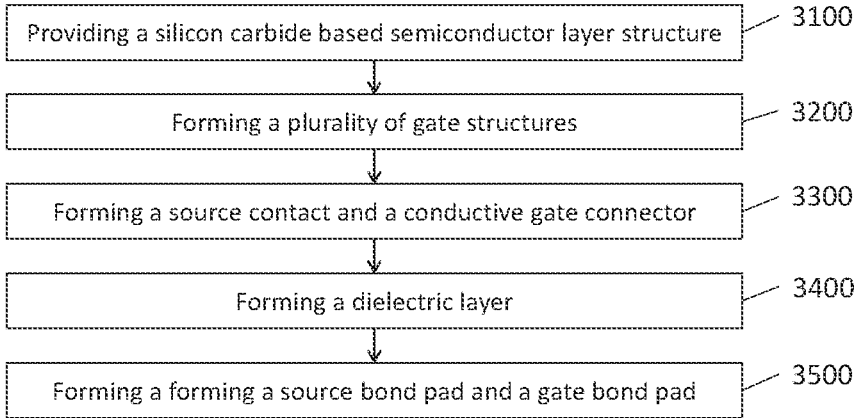
FIG. 32 is a flow chart of a method of forming a MOSFET including double metal layers according to embodiments of the present invention.
Figure 33A:
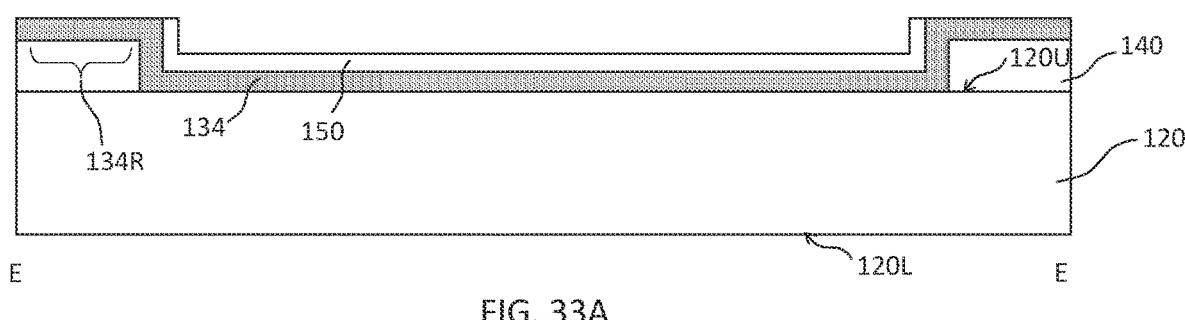
FIGS. 33A, 33B, 34A, 34B, 35A, 35B 36A and 36B are cross-sectional views illustrating a method of forming a MOSFET including double metal layers according to embodiments of the present invention.
Figure 33B:
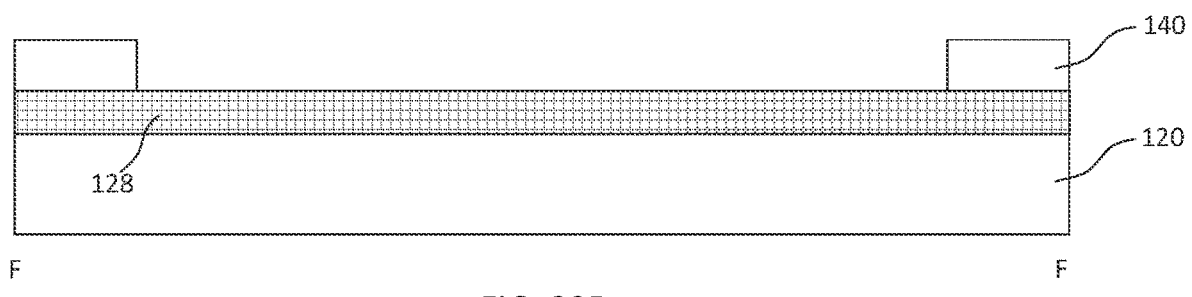
Figure 34A:
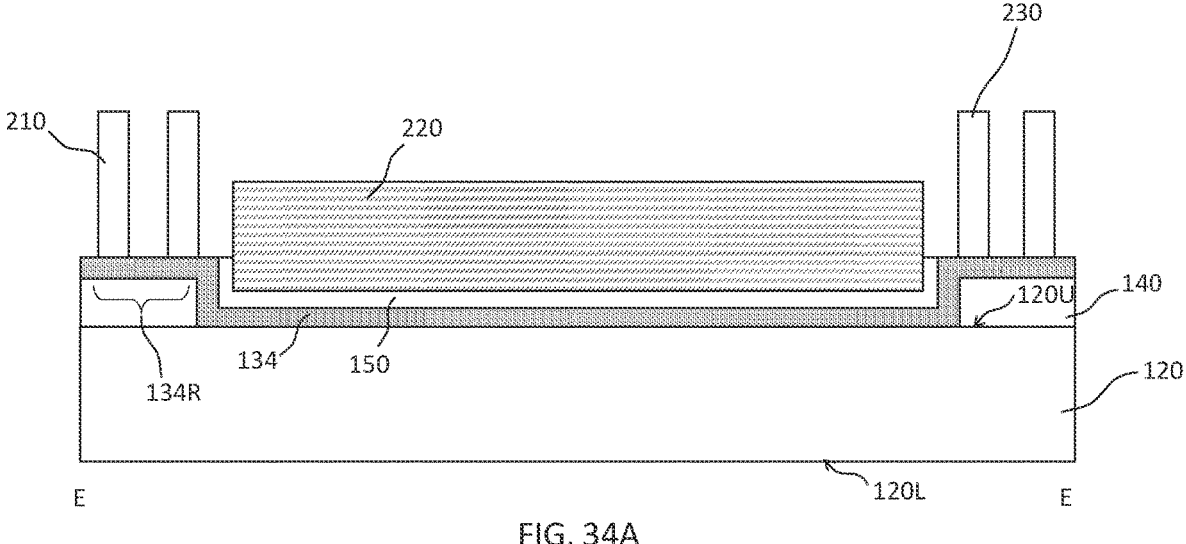
Figure 34B:
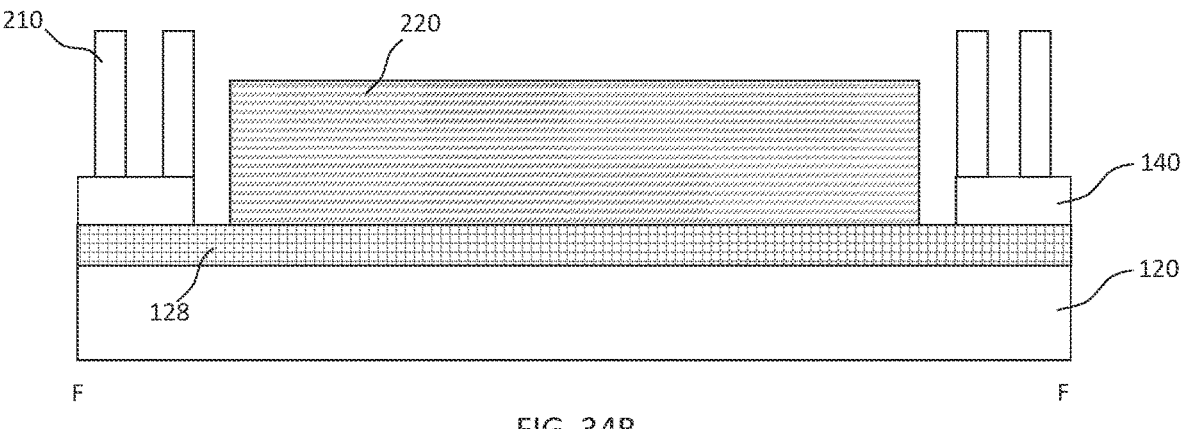
Figure 35A:
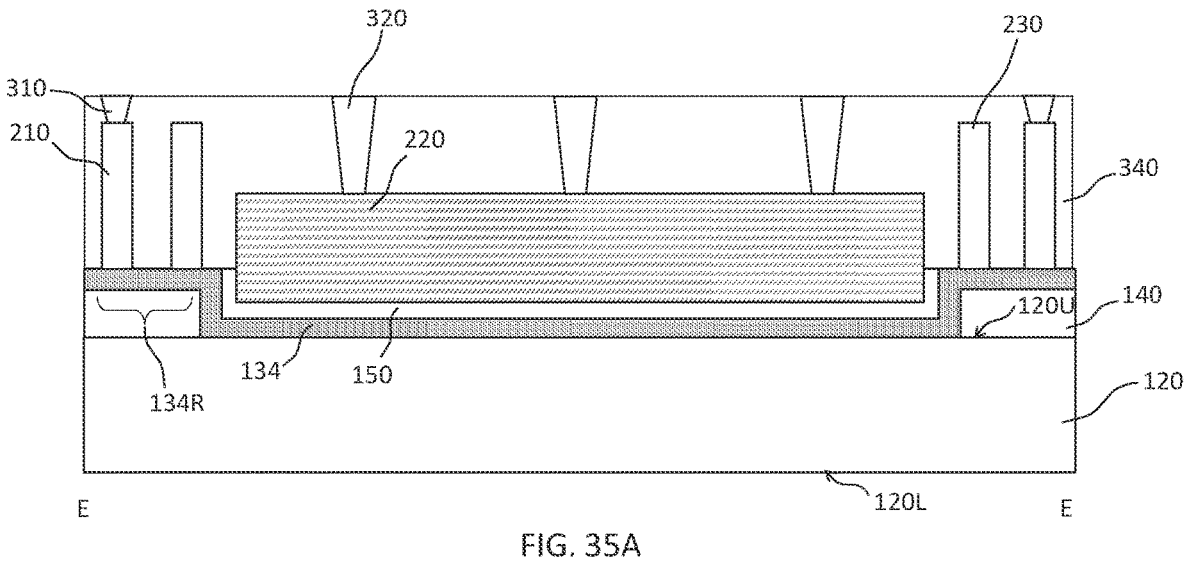
Figure 35B:
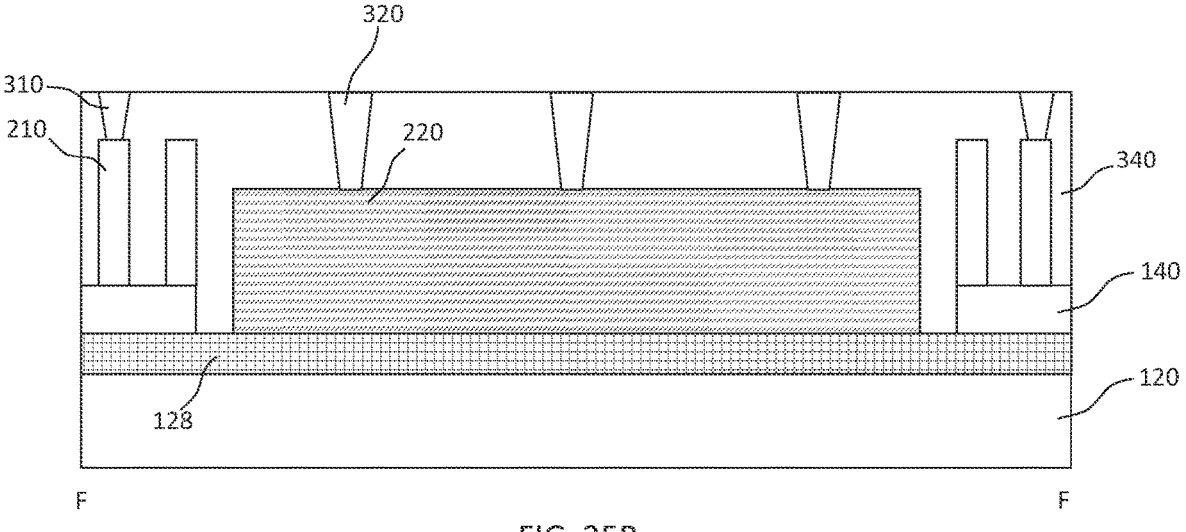
Figure 36A:
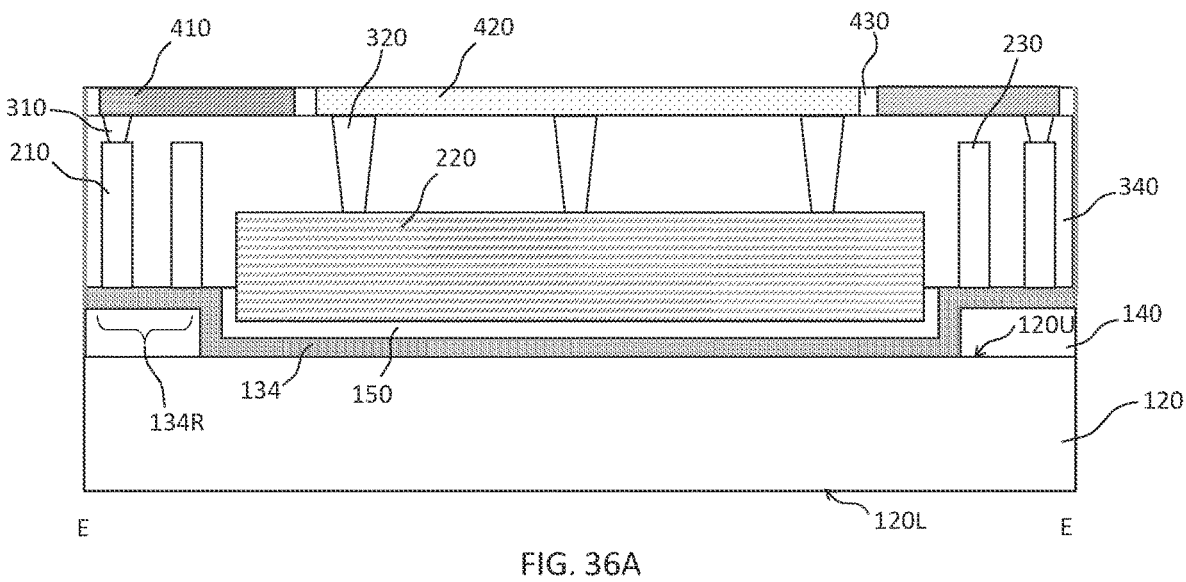
Figure 36B:
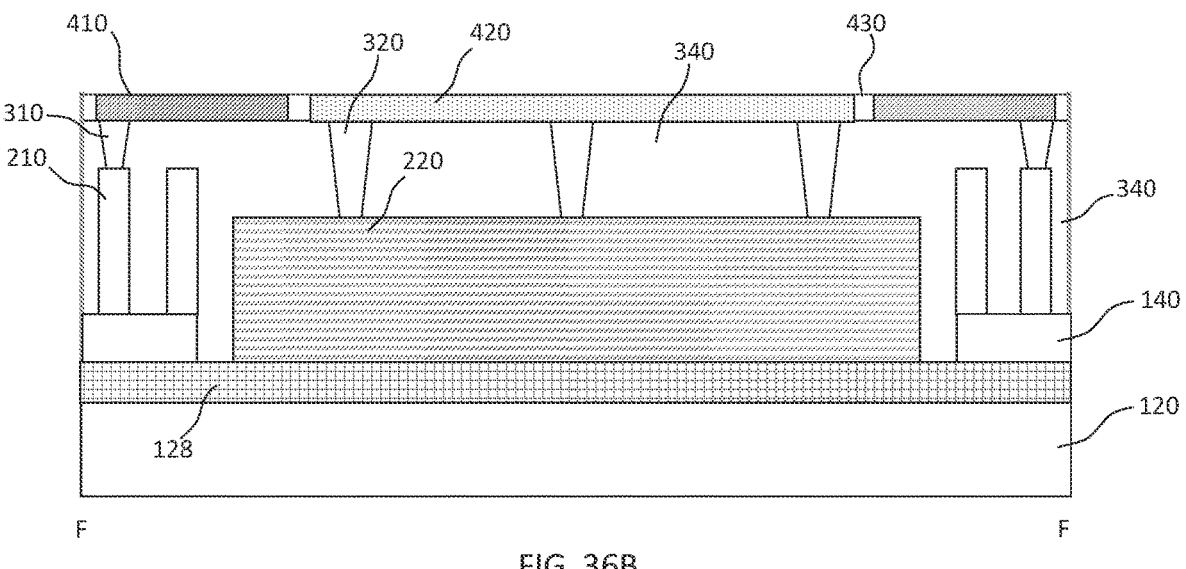

FIG. 32 is a flow chart of a method of forming a MOSFET including double metal layers according to some embodiments of the present invention. FIGS. 33A, 33B, 34A, 34B, 35A, 35B 36A and 36B are cross-sectional views illustrating a method of forming a MOSFET including double metal layers according to embodiments of the present invention. Specifically, FIGS. 33A, 34A, 35A and 36A are cross-sectional views taken along the line E-E in FIG. 10, and FIGS. 33B, 34B, 35B and 36B are cross-sectional views taken along the line F-F in FIG. 10.

Referring to FIGS. 1A, 32, 33A and 33B, the method may include providing a silicon carbide based semiconductor layer structure 120 (Block 3100). The semiconductor layer structure 120 may include an active region defined therein and a plurality of source regions 128 in the active region. A field oxide layer 140 may be formed on an upper surface 120U of the semiconductor layer structure 120.

Referring to FIGS. 1A, 32, 33A and 33B, a plurality of gate structures 160, each of which includes a gate electrode 134, a gate insulating layer (not shown, but interposed between the gate electrode and the semiconductor layer structure as is well known in the art), and a gate capping layer 150 on the gate electrode 134, may be formed on the semiconductor layer structure 120 (Block 3200). The gate electrode 134 may be formed along a surface of the field oxide layer 140 and a portion of the gate electrode 134 formed on the field oxide layer 140 may be used as a gate resistor 134R.

Referring to FIGS. 1A, 32, 34A and 34B, a source contact 220, a conductive gate connector 210 and a gate bus 230 may be formed (Block 3300). The conductive gate connector 210 and the gate bus 230 may be formed, for example, by forming a sacrificial layer on the gate resistor 134R and forming openings in the sacrificial layer, and then filling the openings with a conductive material to form the conductive gate connector 210 and the gate bus 230. The source contact 220 may be formed on the plurality of source regions 128 in the active region and may be electrically connected to the plurality of source regions 128. In some embodiments, the source contact 220 may contact the plurality of source regions 128. The conductive gate connector 210 may be formed on one of the gate electrodes 134 and may be electrically connected thereto. In some embodiments, the conductive gate connector 210 may contact the one of the gate electrodes 134. The conductive gate connector 210 may be formed to vertically overlap the field oxide layer 140.

The source contact 220 and the conductive gate connector 210 may be formed through multiple unit processes. For example, a first metal layer may be formed on the plurality of source regions 128 and the plurality of gate structures 160 and then the first metal layer may be patterned to form the source contact 220 and the conductive gate connector 210. Accordingly, the source contact 220 and the conductive gate connector 210 may include first and second portions of the first metal layer, respectively. The first metal layer may be patterned by performing an etch process using an etch mask layer (e.g., a photoresist layer) that is formed on the first metal layer. In some embodiments, a gate bus 230 including a third portion of the first metal layer may be formed concurrently with the source contact 220 and the conductive gate connector 210.

Referring to FIGS. 1A, 32, 35A and 35B, a dielectric layer 340 may be formed on the source contact 220 and the conductive gate connector 210 (Block 3400). The dielectric layer 340 may cover the source contact 220 and the conductive gate connector 210. A first conductive via 310 and a second conductive via 320 may be formed in the dielectric layer 340. The first conductive via 310 may vertically overlap the conductive gate connector 210 and may be electrically connected thereto. The second conductive via 320 may vertically overlap the source contact 220 and may be electrically connected thereto. In some embodiments, multiple second conductive vias 320 may be formed to vertically overlap the source contact 220.

Referring to FIGS. 1A, 32, 36A and 36B, a source bond pad 420 and a gate bond pad 410 may be formed on the dielectric layer 340 (Block 3500). The source bond pad 420 may be electrically connected to the source contact 220 through the second conductive via 320, and the gate bond pad 410 may be electrically connected to the conductive gate connector 210 through the first conductive via 310. The first conducive via 310 may be interposed between the gate bond pad 410 and the conductive gate connector 210, and the second conductive via 320 may be interposed between the source bond pad 420 and the source contact 220.

The source bond pad 420 and the gate bond pad 410 may be formed through multiple unit processes. For example, a second metal layer may be formed on the dielectric layer 340 and then the second metal layer may be patterned to form the source bond pad 420 and the gate bond pad 410. Accordingly, the source bond pad 420 and the gate bond pad 410 may include first and second portions of the second metal layer, respectively. The second metal layer may be patterned by performing an etch process using an etch mask layer that is formed on the second metal layer. A passivation layer 430 may be formed between the source bond pad 420 and the gate bond pad 410 for electrical isolation therebetween.

In some embodiments, the method may also include, before the source bond pad 420 and the gate bond pad 410 are formed, forming a linear portion (e.g., the first and second gate bus connectors 230L1 and 230L2 in FIG. 21) that is electrically connected to the gate bus 230. The linear portion may be formed on the dielectric layer 340. The liner portion and the gate bus 230 may collectively form a gate bus structure. The linear portion may be formed through multiple unit processes. For example, a third metal layer may be formed on the dielectric layer 340 and then the third metal layer may be patterned to form the linear portion. The third metal layer may be patterned by performing an etch process using an etch mask layer that is formed on the third metal layer.

Figure 1B:
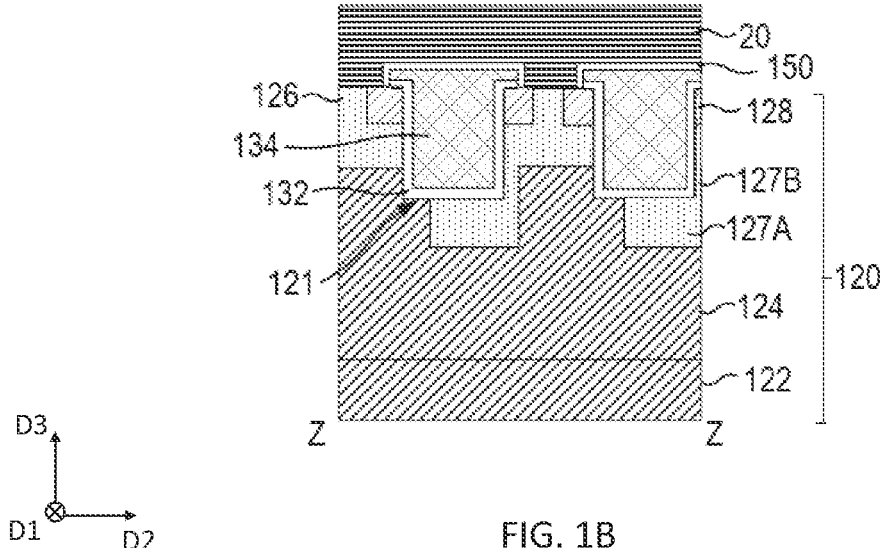
FIG. 1B is a cross-sectional view of an alternative version of the MOSFETs in FIGS. 1, 2 and 5 that includes trench gate electrodes.

While embodiments of the present invention are discussed above with respect to semiconductor devices that have channels that extend laterally underneath gate electrodes that extend on a top surface of the semiconductor layer structure, it will be appreciated that embodiments of the present invention are not limited thereto. For example, in other embodiments, the semiconductor devices may have gate electrodes that extend in trenches that are formed within the semiconductor layer structure. FIG. 1B is a cross-sectional view of an alternative version of the MOSFETs in FIGS. 1, 2 and 5, where the MOSFET is implemented to have trench gate electrodes. As shown in FIG. 1B, the design of the MOSFET of FIG. 1B is similar to the design of the MOSFET of FIG. 1A. However, in the MOSFET of FIG. 1B, trenches 121 are formed in the semiconductor layer structure 120, and the gate insulators 132 are formed along the sidewalls and bottom surfaces of the trenches 121. Heavily-doped p-type (p+) deep shielding patterns 127A may be formed underneath at least a portion of the bottom of each trench 121 to protect the gate insulators from high electric fields during reverse blocking operation. P-type deep shielding connection patterns 127B may electrically connect the deep shielding patterns to the p-type well regions 126. As otherwise the MOSFET FIG. 1B may be generally identical to the MOSFET of FIG. 1A, further description thereof will be omitted. It will be appreciated that any of the MOSFETs or IGBTs according to embodiments of the present invention may have the trench gate electrode design shown in FIG. 1B.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout, except where expressly noted.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

As used herein, the term "plurality" means "at least two" or, equivalently, "two or more."

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device, comprising:
   a silicon carbide based semiconductor layer structure comprising an active region defined therein;

a gate bond pad that is on a first side of the semiconductor layer structure and vertically overlapping the active region;

a source contact that is on the first side of the semiconductor layer structure;

a source bond pad on the first side of the semiconductor layer structure and electrically connected to the source contact; and a gate bus connector electrically connected to the gate bond pad, the gate bus connector between the source contact and the source bond pad and vertically overlapping the source contact and the source bond pad.

2. The semiconductor device of claim 1, wherein more than half the gate bond pad vertically overlaps the active region.

3. The semiconductor device of claim 1, further comprising:

a plurality of source regions in the active region, wherein the source contact is electrically connected to the plurality of source regions, and the source contact extends underneath the gate bond pad.

4. The semiconductor device of claim 3, further comprising:

a gate bus that is electrically connected to the gate bond pad; and a dielectric layer that covers the gate bus and the source contact.

5. The semiconductor device of claim 4, wherein the source bond pad is electrically connected to the source contact through one or more first conductive vias that extend through the dielectric layer.

6. The semiconductor device of claim 4, further comprising a conductive gate connector that is underneath the gate bond pad and is electrically connected to the gate bond pad through a second conductive via that extends through the dielectric layer.

7. The semiconductor device of claim 1, wherein the gate bond pad comprises a first gate bond pad, and the semiconductor device further comprises a second gate bond pad that is spaced apart from the first gate bond pad, and wherein the second gate bond pad is on the semiconductor layer structure and vertically overlaps the active region.

8. The semiconductor device of claim 7, further comprising a third gate bond pad that is positioned between the first gate bond pad and the second gate bond pad.

9. The semiconductor device of claim 7, further comprising a third gate bond pad and a fourth gate bond pad, wherein the first, second, third and fourth gate bond pads are positioned above respective first, second, third and fourth corner regions of the semiconductor layer structure.

10. The semiconductor device of claim 1, further comprising:

a plurality of source regions in the active region that are electrically connected to the source contact; and a gate bus that is electrically connected to the gate bond pad, wherein the gate bus is electrically connected to the gate bus connector.

11. The semiconductor device of claim 1, wherein the gate bond pad comprises a first gate bond pad, and the semiconductor device further comprises:

a second gate bond pad that is on the semiconductor layer structure, vertically overlaps the active region and is spaced apart from the first gate bond pad in a first horizontal direction that is parallel to an upper surface of the semiconductor layer structure;

22 a first gate resistor that is electrically connected to the first gate bond pad and extends longitudinally in a second horizontal direction that is parallel to the upper surface of the semiconductor layer structure and is different from the first horizontal direction; and a second gate resistor that is electrically connected to the second gate bond pad and extends longitudinally in the second horizontal direction.

12. The semiconductor device of claim 1, wherein the gate bus connector is between the source contact and the source bond pad.

13. The semiconductor device of claim 1, wherein the gate bus connector is between the source contact and the gate bond pad.

14. The semiconductor device of claim 1, wherein the gate bond pad and the gate bus connector are electrically connected through a gate electrode, the gate electrode extending under the source bond pad.

15. The semiconductor device of claim 1, wherein the semiconductor device comprises a metal-oxide semiconductor field effect transistor.

16. The semiconductor device of claim 1, further comprising a conductive gate bus plug that is electrically connected to the gate bus connector and a field oxide layer, the field oxide layer in between the conductive gate bus plug and the semiconductor layer structure and underneath and vertically overlapping the source bond pad, wherein a first of gate electrode in a plurality of gate electrodes is between the field oxide layer and the conductive gate bus plug.

17. A semiconductor device, comprising:

a silicon carbide based semiconductor layer structure comprising an active region defined therein, the semiconductor layer structure comprising a silicon carbide drift region having a first conductivity type, a plurality of silicon carbide well regions having a second conductivity type that is different than the first conductivity type on the silicon carbide drift region, and a plurality of silicon carbide source regions having the first conductivity type in the respective silicon carbide well regions;

a source contact that is electrically connected to the plurality of silicon carbide source regions;

a plurality of gate electrodes on a first side of the semiconductor layer structure;

a first gate pad on the first side of the semiconductor layer structure; and a second gate pad on the first side of the semiconductor layer structure, wherein the first gate pad is above and vertically overlapping the source contact.

18. The semiconductor device of claim 17, further comprising a gate bus connector and a dielectric layer that is interposed between the source contact and the gate bus connector.

19. The semiconductor device of claim 18, further comprising a conductive gate bus plug that is in the dielectric layer, protrudes from the gate bus connector toward the semiconductor layer structure and contacts one of the plurality of gate electrodes.

20. The semiconductor device of claim 17, further comprising a first gate bus connector and a second gate bus connector, and the first gate bus connector extends longitudinally in a first horizontal direction that is parallel to an upper surface of the semiconductor layer structure, and the second gate bus connector protrudes from the first gate bus connector and extends longitudinally in a second horizontal direction that is parallel to the upper surface of the semiconductor layer structure and is different from the first horizontal direction.

21. The semiconductor device of claim 17, wherein the first gate pad vertically overlaps the active region.

22. The semiconductor device of claim 17, further comprising:

a conductive gate connector, wherein a gate bond pad vertically overlaps the conductive gate connector; and a conductive via that is interposed between the gate bond pad and the conductive gate connector and contacts both the gate bond pad and the conductive gate connector.

23. The semiconductor device of claim 17, further comprising a gate bus connector, a gate bus and a conductive gate bus plug, wherein the plurality of gate electrodes comprises a first gate electrode, and wherein the conductive gate bus plug is electrically connected to the gate bus connector and the first gate electrode, and an upper surface of the gate bus connector is higher than an upper surface of the conductive gate bus plug.

24. The semiconductor device of claim 23, wherein the conductive gate bus plug contacts the first gate electrode.

25. The semiconductor device of claim 17, wherein the semiconductor device comprises a metal-oxide semiconductor field effect transistor.

26. A semiconductor device, comprising:

a silicon carbide based semiconductor layer structure comprising an active region defined therein;

a plurality of source regions in the active region;

a source bond pad on a first side of the semiconductor layer structure;

a gate bond pad on the first side of the semiconductor layer structure;

a plurality of gate electrodes on the semiconductor layer structure;

a conductive gate bus plug that is electrically connected to the gate bond pad; and a field oxide layer in between the conductive gate bus plug and the semiconductor layer structure and underneath and vertically overlapping the source bond pad.

27. A semiconductor device, comprising:

a silicon carbide based semiconductor layer structure comprising a drift region comprising an active region defined therein;

a plurality of source regions in the active region;

a source contact that is electrically connected to the plurality of source regions;

a plurality of gate electrodes on a first side of the semiconductor layer structure;

a first gate pad on the first side of the semiconductor layer structure;

a second gate pad on the first side of the semiconductor layer structure;

a gate bus that is electrically connected to the plurality of gate electrodes; and a source bond pad on the first side of the semiconductor layer structure that is electrically connected to the source contact; and a gate bus connector that is electrically connected to the gate bus, the gate bus connector between the source contact and the source bond pad and vertically overlapping the source contact and the source bond pad.

* * * * *